(12) United States Patent
Hirose et al.

(10) Patent No.: US 12,181,273 B2
(45) Date of Patent: Dec. 31, 2024

(54) THREE-DIMENSIONAL MEASUREMENT DEVICE

(71) Applicant: HAMAMATSU PHOTONICS K.K., Hamamatsu (JP)

(72) Inventors: Kazuyoshi Hirose, Hamamatsu (JP); Hiroki Kamei, Hamamatsu (JP); Takahiro Sugiyama, Hamamatsu (JP); Akiyoshi Watanabe, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 49 days.

(21) Appl. No.: 17/175,059

(22) Filed: Feb. 12, 2021

(65) Prior Publication Data
US 2021/0262787 A1    Aug. 26, 2021

(30) Foreign Application Priority Data

Feb. 21, 2020 (JP) ................................ 2020-028446
Aug. 26, 2020 (JP) ................................ 2020-142715
Nov. 30, 2020 (JP) ................................ 2020-198371

(51) Int. Cl.
*G01B 11/25* (2006.01)
*G06T 7/521* (2017.01)
*G06V 10/145* (2022.01)

(52) U.S. Cl.
CPC .......... *G01B 11/2513* (2013.01); *G06T 7/521* (2017.01); *G06V 10/145* (2022.01); *G06V 2201/12* (2022.01)

(58) Field of Classification Search
USPC .......................... 382/103, 154, 106; 356/603
See application file for complete search history.

(56) References Cited

U.S. PATENT DOCUMENTS 5,047,845 A * 9/1991 Tomlinson ................ G01J 9/02
356/28.5
5,973,784 A * 10/1999 Szwaykowski .... G01B 11/2441
356/495

(Continued)

FOREIGN PATENT DOCUMENTS

JP    2004-251699 A    9/2004
JP    2008-016829 A    1/2008

(Continued)

OTHER PUBLICATIONS

Y. Kurosaka et al., "Effects of non-lasing band in two-dimensional photonic-crystal lasers clarified using omnidirectional band structure", Opt. Express,vol. 20,Issue19,Sep 7.2012, p. 21773-p21783.

*Primary Examiner* — Kathleen Y Dulaney
(74) *Attorney, Agent, or Firm* — Faegre Drinker Biddle & Reath LLP

(57) ABSTRACT

A three-dimensional measurement device includes one or a plurality of light source units configured to irradiate the object to be measured SA with measurement light having a predetermined pattern, one or a plurality of image capture units configured to capture an image of the object to be measured which is irradiated with the measurement light, and a measurement unit configured to measure a three-dimensional shape of the object to be measured on the basis of results of image capture performed by the image capture units. The light source units are constituted by an S-iPMSEL of M-point oscillation.

12 Claims, 35 Drawing Sheets

(56) References Cited

U.S. PATENT DOCUMENTS

| | | | | |
|---|---|---|---|---|
| 6,031,612 | A * | 2/2000 | Shirley | G01B 11/2531 356/511 |
| 6,449,048 | B1 * | 9/2002 | Olszak | G01B 11/2441 356/497 |
| 6,690,474 | B1 * | 2/2004 | Shirley | G01B 11/2527 356/605 |
| 7,542,185 | B2 * | 6/2009 | Tsukagoshi | G03H 1/0256 430/1 |
| 8,532,340 | B2 * | 9/2013 | Kruglick | G06V 10/145 356/605 |
| 8,630,481 | B2 * | 1/2014 | Kane | G07D 7/202 382/218 |
| 8,873,068 | B2 * | 10/2014 | Blain | G01B 9/02098 356/520 |
| 8,908,958 | B2 * | 12/2014 | Kimmel | G01B 11/2509 348/51 |
| 8,929,644 | B2 * | 1/2015 | Zhang | G01B 11/2513 382/154 |
| 10,222,474 | B1 * | 3/2019 | Raring | H01S 5/02212 |
| 11,503,228 | B2 * | 11/2022 | Zhang | G06V 20/64 |
| 2003/0038933 | A1 * | 2/2003 | Shirley | G01B 21/042 356/243.1 |
| 2003/0231175 | A1 * | 12/2003 | Pfister | G06T 15/205 345/419 |
| 2005/0146778 | A1 * | 7/2005 | Noda | G02B 6/1225 359/321 |
| 2007/0025612 | A1 * | 2/2007 | Iwasaki | G01B 11/25 382/154 |
| 2007/0175860 | A1 * | 8/2007 | Liu | G03F 7/0005 438/689 |
| 2008/0037032 | A1 * | 2/2008 | Scogin | G01B 11/25 356/606 |
| 2008/0240502 | A1 * | 10/2008 | Freedman | G06V 10/145 382/103 |
| 2008/0273194 | A1 * | 11/2008 | De Sloovere | G01B 11/25 356/139.09 |
| 2010/0141740 | A1 * | 6/2010 | Munkelt | G01B 11/2545 348/47 |
| 2011/0298896 | A1 * | 12/2011 | Dillon | G02B 27/48 348/46 |
| 2012/0127437 | A1 * | 5/2012 | Kuksenkov | G02F 1/3775 359/328 |
| 2012/0176478 | A1 * | 7/2012 | Wang | G01B 11/2536 348/136 |
| 2013/0301909 | A1 * | 11/2013 | Sato | G01B 11/25 382/154 |
| 2013/0307932 | A1 * | 11/2013 | Mestha | G06V 20/593 348/E5.029 |
| 2014/0064603 | A1 * | 3/2014 | Zhang | G01B 11/2513 382/154 |
| 2014/0226158 | A1 * | 8/2014 | Trainer | G01J 3/453 356/336 |
| 2014/0348193 | A1 * | 11/2014 | Noda | H01S 5/1218 372/45.01 |
| 2014/0355635 | A1 * | 12/2014 | Iwahashi | H01S 5/11 372/45.01 |
| 2015/0070472 | A1 * | 3/2015 | Chen | G01B 11/2531 348/47 |
| 2015/0084884 | A1 * | 3/2015 | Cherradi El Fadili | G06F 3/0233 345/173 |
| 2015/0176972 | A1 * | 6/2015 | Tait | G01B 11/005 33/503 |
| 2016/0065945 | A1 * | 3/2016 | Yin | G02B 26/127 359/200.7 |
| 2016/0109575 | A1 * | 4/2016 | Oggier | G01S 7/4911 356/51 |
| 2016/0261093 | A1 * | 9/2016 | Noda | H01S 3/0085 |
| 2017/0163969 | A1 * | 6/2017 | Cronie | G06V 10/40 |
| 2017/0220000 | A1 * | 8/2017 | Ozcan | G03H 1/0866 |
| 2018/0006426 | A1 * | 1/2018 | Takiguchi | G02F 1/133504 |
| 2018/0026419 | A1 * | 1/2018 | Hirose | H01S 5/18394 353/22 |
| 2018/0109075 | A1 * | 4/2018 | Kurosaka | H01S 5/42 |
| 2018/0124382 | A1 * | 5/2018 | Smith | G06T 7/55 |
| 2018/0176544 | A1 * | 6/2018 | Wang | H04N 17/002 |
| 2019/0013647 | A1 * | 1/2019 | Higuchi | H01S 5/18394 |
| 2019/0049237 | A1 * | 2/2019 | Watanabe | G01B 11/2441 |
| 2019/0079192 | A1 * | 3/2019 | Fenton | G01S 17/42 |
| 2019/0107389 | A1 * | 4/2019 | Ahmed | H01S 5/0651 |
| 2019/0181613 | A1 * | 6/2019 | Kurosaka | H01S 5/11 |
| 2019/0252856 | A1 * | 8/2019 | Hirose | H01S 5/187 |
| 2019/0288483 | A1 * | 9/2019 | Sugiyama | H01S 5/04256 |
| 2019/0312412 | A1 * | 10/2019 | Kurosaka | H01S 5/34313 |
| 2019/0319428 | A1 * | 10/2019 | Kanzaki | H01S 5/18 |
| 2019/0381736 | A1 * | 12/2019 | Jensen | G01B 11/2518 |
| 2019/0391243 | A1 * | 12/2019 | Nicolaescu | G01S 17/42 |
| 2020/0028322 | A1 * | 1/2020 | Noda | H01S 5/0267 |
| 2020/0057831 | A1 * | 2/2020 | Wu | G06T 7/70 |
| 2020/0058153 | A1 * | 2/2020 | Ouyang | G06V 20/647 |
| 2020/0092524 | A1 * | 3/2020 | Morris | G01B 11/2513 |
| 2020/0124410 | A1 * | 4/2020 | Haugen | H04N 25/71 |
| 2020/0200348 | A1 * | 6/2020 | Romero | H01S 5/02355 |
| 2020/0200363 | A1 * | 6/2020 | Harrison | H01S 5/32341 |
| 2020/0211197 | A1 * | 7/2020 | Zhang | G06T 7/593 |
| 2020/0213533 | A1 * | 7/2020 | Zhang | G06T 7/174 |
| 2020/0287350 | A1 * | 9/2020 | Kurosaka | H01S 5/11 |
| 2020/0373739 | A1 * | 11/2020 | Hirose | H01S 5/222 |
| 2021/0102801 | A1 * | 4/2021 | Chen | G01B 11/2504 |
| 2021/0152810 | A1 * | 5/2021 | Jensen | H04N 13/246 |
| 2021/0156881 | A1 * | 5/2021 | Zweigle | G01P 3/38 |
| 2021/0249841 | A1 * | 8/2021 | Aoki | H01S 5/34333 |
| 2021/0389124 | A1 * | 12/2021 | Stoutamire | G01B 11/2527 |
| 2022/0011096 | A1 * | 1/2022 | Morozov | G06T 7/521 |
| 2022/0037849 | A1 * | 2/2022 | Ito | H01S 5/11 |
| 2022/0131343 | A1 * | 4/2022 | Noda | H01S 5/11 |
| 2022/0221270 | A1 * | 7/2022 | Zuo | G01B 11/2513 |
| 2022/0290977 | A1 * | 9/2022 | Xu | G01B 11/254 |
| 2022/0299314 | A1 * | 9/2022 | Xu | G01B 11/25 |

FOREIGN PATENT DOCUMENTS

| | | |
|---|---|---|
| JP | 2009-264852 A | 11/2009 |
| JP | 2011-242178 A | 12/2011 |
| JP | 2014-186010 A | 10/2014 |
| JP | 2018-204976 A | 12/2018 |
| JP | 2019-125112 A | 7/2019 |
| JP | 2019-168286 A | 10/2019 |
| JP | 2022-007906 A | 1/2022 |
| WO | WO-2016/148075 A1 | 9/2016 |
| WO | WO 2018/181202 A1 | 10/2018 |
| WO | WO-2019/177066 A1 | 9/2019 |
| WO | WO 2019/221133 A1 | 11/2019 |
| WO | WO 2020/129787 A1 | 6/2020 |

* cited by examiner

*Fig.11*

| $\phi_A$ | $\phi_B$ | $\phi_A$ | $\phi_B$ | $\phi_A$ | $\phi_B$ |
|---|---|---|---|---|---|
| $\phi_B$ | $\phi_A$ | $\phi_B$ | $\phi_A$ | $\phi_B$ | $\phi_A$ |
| $\phi_A$ | $\phi_B$ | $\phi_A$ | $\phi_B$ | $\phi_A$ | $\phi_B$ |
| $\phi_B$ | $\phi_A$ | $\phi_B$ | $\phi_A$ | $\phi_B$ | $\phi_A$ |
| $\phi_A$ | $\phi_B$ | $\phi_A$ | $\phi_B$ | $\phi_A$ | $\phi_B$ |
| $\phi_B$ | $\phi_A$ | $\phi_B$ | $\phi_A$ | $\phi_B$ | $\phi_A$ |

Fig.22

| | | | | | | | | | | | | | | | | |
|---|---|---|---|---|---|---|---|---|---|---|---|---|---|---|---|---|
| Pattern1 | MOST SIGNIFICANT BIT | 0 | 0 | 0 | 0 | 0 | 0 | 0 | 0 | 1 | 1 | 1 | 1 | 1 | 1 | 1 | 1 | — W4a
| Pattern2 | SECOND-ORDER BIT | 0 | 0 | 0 | 0 | 1 | 1 | 1 | 1 | 1 | 1 | 1 | 1 | 0 | 0 | 0 | 0 | — W4b
| Pattern3 | THIRD-ORDER BIT | 0 | 0 | 1 | 1 | 1 | 1 | 0 | 0 | 0 | 0 | 1 | 1 | 1 | 1 | 0 | 0 | — W4c
| Pattern4 | LEAST SIGNIFICANT BIT | 0 | 1 | 1 | 0 | 0 | 1 | 1 | 0 | 0 | 1 | 1 | 0 | 0 | 1 | 1 | 0 | — W4d
| Gray code (4 BIT) | | 0 | 1 | 3 | 2 | 6 | 7 | 5 | 4 | 12 | 13 | 15 | 14 | 10 | 11 | 9 | 8 |
| SPACE code | | 0 | 1 | 2 | 3 | 4 | 5 | 6 | 7 | 8 | 9 | 10 | 11 | 12 | 13 | 14 | 15 |

W4

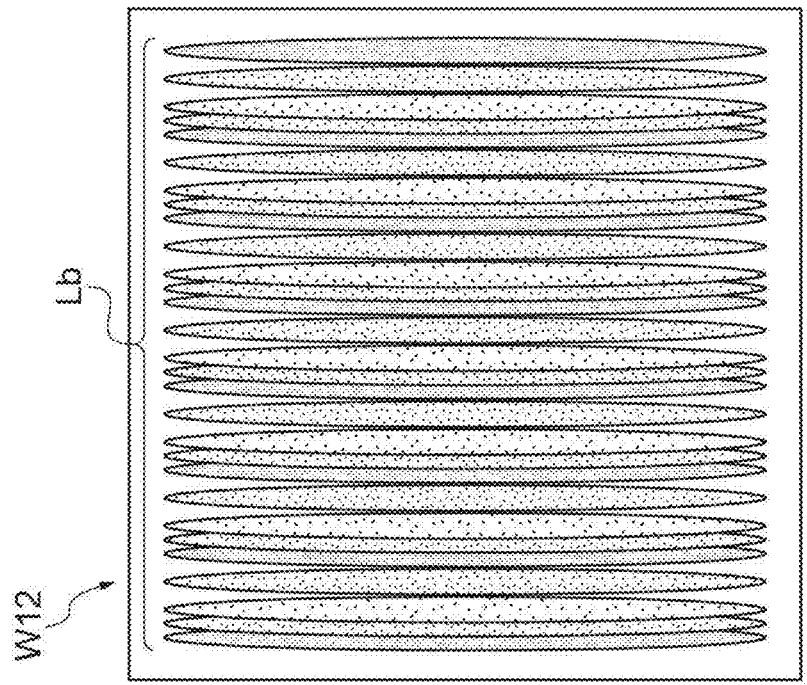
*Fig.34B*
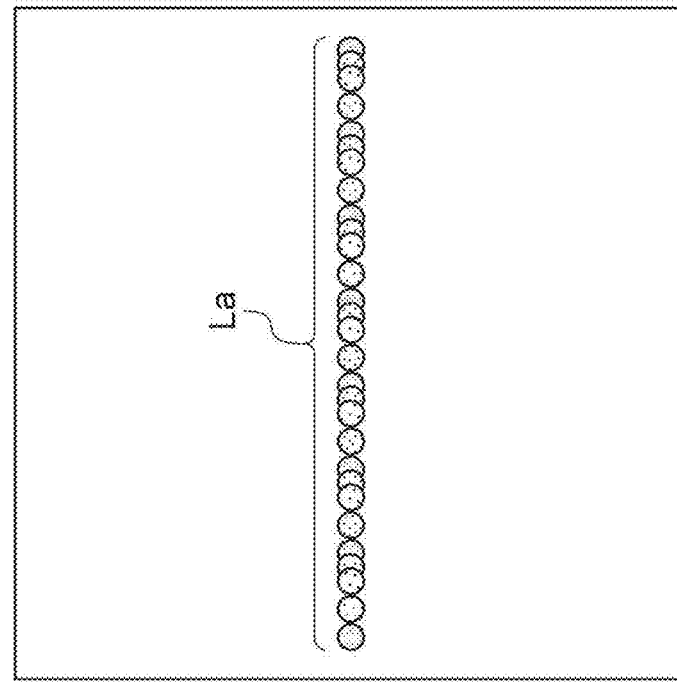
*Fig.34A*
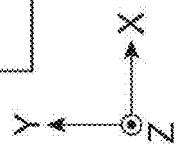

THREE-DIMENSIONAL MEASUREMENT DEVICE

TECHNICAL FIELD

The present disclosure relates to a three-dimensional measurement device.

BACKGROUND

As a three-dimensional measurement method of the related art, there is, for example, a method disclosed in Specification of United States Patent Application Publication No. 2008/0240502 (Patent Literature 1). In this method of Patent Literature 1, an object to be measured is irradiated with random dot patterns, and images of dot patterns located at the same position are captured by two cameras. The three-dimensional measurement of the object to be measured is performed using the principle of triangulation on the basis of a disparity between the two dot patterns.

In addition, for example, a method disclosed in Japanese Unexamined Patent Publication No. 2011-242178 (Patent Literature 2) is a measurement method using a phase shift method. In this method of Patent Literature 2, a reference flat plate having a reference surface onto which a lattice pattern is projected is prepared, and the reference flat plate is moved by a stage in parallel to a normal direction. An image of the lattice pattern projected onto the reference surface and an image of the lattice pattern projected onto an object to be measured are captured, and the spatial coordinates of the object to be measured are calculated using a table in which the phases and spatial coordinates of the lattice pattern are associated with each other.

SUMMARY

A projector is used as a light source in the above-described method of Patent Literature 1, and an LED array is used as a light source in the method of Patent Literature 2. For this reason, there is a problem in that a three-dimensional measurement device becomes relatively large. As an image capturing device, for example, a subminiature camera having a size of 1 square mm or less has also been developed, and in order to reduce the size of the three-dimensional measurement device as a whole, it is important to reduce the size of the light source. In a case where the overall size of the three-dimensional measurement device can be reduced, it can be considered possible to apply the three-dimensional measurement device in applications such as, for example, mouth inspection, endoscopic inspection, inspection of narrow places such as the inside of a tube or a gap between walls, or inspection of household furniture, a device, or the like from below the floor, and to construct a handy-type three-dimensional measurement device. In addition, when the light source is applied to the three-dimensional measurement device, the light source is preferably a light source in which noise or distortion of light to be output is suppressed from the viewpoint of improving accuracy of measurement.

The present disclosure was contrived in order to solve the above problem, and an object thereof is to provide a three-dimensional measurement device in which the expansion of an application range is achieved by a reduction in the size of the device and an improvement in the accuracy of measurement is achieved.

According to an aspect of the present disclosure, there is provided a three-dimensional measurement device including: one or a plurality of light source units configured to irradiate an object to be measured with measurement light having a predetermined pattern; one or a plurality of image capture units configured to capture an image of the object to be measured which is irradiated with the measurement light; and a measurement unit configured to measure a three-dimensional shape of the object to be measured on the basis of results of image capture performed by the image capture units, wherein the light source units are constituted by an S-iPMSEL of M-point oscillation.

In the three-dimensional measurement device, the light source units are constituted by an S-iPMSEL of M-point oscillation. The S-iPMSEL includes a phase modulation layer having a fundamental layer and a plurality of different refractive index regions that differ in refractive index from the fundamental layer, and the position of the center of gravity of each different refractive index region is shifted from the lattice point position of a virtual square lattice in accordance with an output light image. The S-iPMSEL is configured to have, for example, about the size of a needle tip, and can output a light image of a two-dimensional pattern in a direction perpendicular to or inclined with respect to the main surface of a substrate provided with the phase modulation layer. Therefore, by using the S-iPMSEL as a light source, it is possible to realize a reduction in the overall size of the three-dimensional measurement device, and to achieve the expansion of the application range of the device. In addition, by using the S-iPMSEL of M-point oscillation, it is possible to eliminate an output of 0-order light (a diffracted wave component which is not phase-modulated) different from the light image of a desired two-dimensional pattern. Thereby, it is possible to irradiate the object to be measured with the measurement light having a pattern without noise or distortion caused by the 0-order light, and to achieve an improvement in the accuracy of measurement.

The three-dimensional measurement device may further include a single light source unit and a plurality of the image capture units, the predetermined pattern of the measurement light may be a periodic pattern consisting of any of a dot pattern, a stripe pattern, and a lattice pattern, and the measurement unit may measure the three-dimensional shape of the object to be measured on the basis of an active stereo method using the periodic pattern. In this case, it is possible to perform three-dimensional measurement using an image having little texture and three-dimensional measurement in a dark portion.

The three-dimensional measurement device may further include a single light source unit and a plurality of the image capture units, the predetermined pattern of the measurement light may be a random dot pattern, and the measurement unit may measure the three-dimensional shape of the object to be measured on the basis of an active stereo method using the random dot pattern. In this case, by using the random dot pattern instead of a periodic dot pattern, it is possible to suppress misrecognition when the same point of the dot pattern is imaged by a different image capture unit.

The three-dimensional measurement device may further include a single light source unit and a plurality of the image capture units, the predetermined pattern of the measurement light may be a pattern having a uniform density, and the measurement unit may measure the three-dimensional shape of the object to be measured on the basis of an active stereo method using the pattern having a uniform density. Since light emitted from the S-iPMSEL is a laser beam, speckles can occur in scattered light. Therefore, even in a case where the pattern having a uniform density is used, the random dot pattern is formed in the pattern of the measurement light. By using this random dot pattern, it is possible to suppress misrecognition when the same point of the dot pattern is imaged by a different image capture unit.

The three-dimensional measurement device may further include a plurality of the light source units and a single image capture unit, the predetermined pattern of the measurement light may be a gray code pattern, and the measurement unit may measure the three-dimensional shape of the object to be measured on the basis of a triangulation method using the gray code pattern. Since the number of patterns of the gray code pattern may be smaller than the number of pixels of the image capture unit, irradiation with the measurement light having the gray code pattern can be realized by a small number of light source units. In a case where the gray code is used, a Hamming distance between adjacent pixels is set to 1. Even in a case where a bit error occurs when a bit string is restored, the error falls within 1. That is, in the gray code, a code resistant to noise is obtained.

The three-dimensional measurement device may further include a plurality of the light source units and a single image capture unit, the predetermined pattern of the measurement light may be a sinusoidal stripe pattern, and the measurement unit may measure the three-dimensional shape of the object to be measured on the basis of a phase shift method using the sinusoidal stripe pattern. In this case, the measured phase is converted into height, so that it is possible to measure the height of the object to be measured at an interval smaller than the pitch of the sinusoidal stripe pattern.

The plurality of light source units may output sinusoidal stripe patterns having different periods from each other. In the phase shift method, discontinuity in a phase of $2\pi$ has arisen as a problem. On the other hand, by using the sinusoidal stripe patterns having different periods from each other, it is possible to improve the discontinuity in a phase of $2\pi$, and to realize high-accuracy three-dimensional measurement using a small number of patterns.

The three-dimensional measurement device may further include a plurality of the light source units and a single image capture unit, the predetermined pattern of the measurement light may be a sinusoidal stripe pattern, and the measurement unit may measure the three-dimensional shape of the object to be measured on the basis of a sampling moire method using the sinusoidal stripe pattern. In this case, it is possible to realize high-accuracy three-dimensional measurement using a smaller number of patterns.

The three-dimensional measurement device may further include a plurality of the light source units and a single image capture unit, the predetermined pattern of the measurement light may be a superimposition pattern obtained by superimposing a sinusoidal stripe pattern on a random dot pattern, and the measurement unit may measure the three-dimensional shape of the object to be measured on the basis of a phase shift method using the superimposition pattern. In the phase shift method, discontinuity in a phase of $2\pi$ has arisen as a problem. On the other hand, by using the random dot pattern, it is possible to improve the discontinuity in a phase of $2\pi$, and to realize high-accuracy three-dimensional measurement using a small number of patterns.

The three-dimensional measurement device may further include a plurality of the light source units and a single image capture unit, the predetermined pattern of the measurement light may include a sinusoidal stripe pattern and a gray code pattern, and the measurement unit may measure the three-dimensional shape of the object to be measured on the basis of a phase shift method using the sinusoidal stripe pattern and a triangulation method using the gray code pattern. In the phase shift method, the discontinuity in a phase of $2\pi$ has arisen as a problem. On the other hand, by using the gray code, it is possible to improve the discontinuity in a phase of $2\pi$, and to realize high-accuracy three-dimensional measurement using a small number of patterns.

The three-dimensional measurement device may further include a plurality of the light source units and a plurality of the image capture units, the predetermined pattern of the measurement light may be a sinusoidal stripe pattern, and the measurement unit may measure the three-dimensional shape of the object to be measured on the basis of a phase shift method and an active stereo method using the sinusoidal stripe pattern. In this case, the measured phase is converted into height, so that it is possible to measure the height of the object to be measured at an interval smaller than the pitch of the sinusoidal stripe pattern. In addition, in the phase shift method, the discontinuity in a phase of $2\pi$ has arisen as a problem. On the other hand, by also using the active stereo method using the plurality of image capture units, it is possible to improve the discontinuity in a phase of $2\pi$, and to realize high-accuracy three-dimensional measurement using a small number of patterns.

The light source units and the image capture units may be disposed on a surface of a three-dimensional object. In this case, the three-dimensional object on which the light source units and the image capture units are disposed can be constituted as a probe of the three-dimensional measurement device. By using the three-dimensional object, sets of the light source units and the image capture units can be directed in different directions from each other, and thus it is possible to perform the three-dimensional shape measurement of the object to be measured at a wide solid angle. In addition, it is easy to apply the three-dimensional measurement device in applications such as, for example, mouth inspection, endoscopic inspection, inspection of narrow places such as the inside of a tube or a gap between walls, or inspection of household furniture, a device, or the like from below the floor, and to construct a handy-type three-dimensional measurement device.

BRIEF DESCRIPTION OF THE DRAWINGS

FIG. 11 is a diagram conceptually illustrating an example of a rotation angle distribution φ2(x, y).

FIG. 22 is a diagram illustrating an example of a gray code pattern which is used in the second embodiment.

FIG. 34A is a schematic diagram illustrating another example of the laser beam of the multi-point pattern.

FIG. 34B is a schematic diagram illustrating an example of a stripe pattern using the multi-point pattern shown in FIG. 34A.

DETAILED DESCRIPTION

Hereinafter, a preferred embodiment of a three-dimensional measurement device according to an aspect of the present disclosure will be described in detail with reference to the accompanying drawings.

Figure 15:
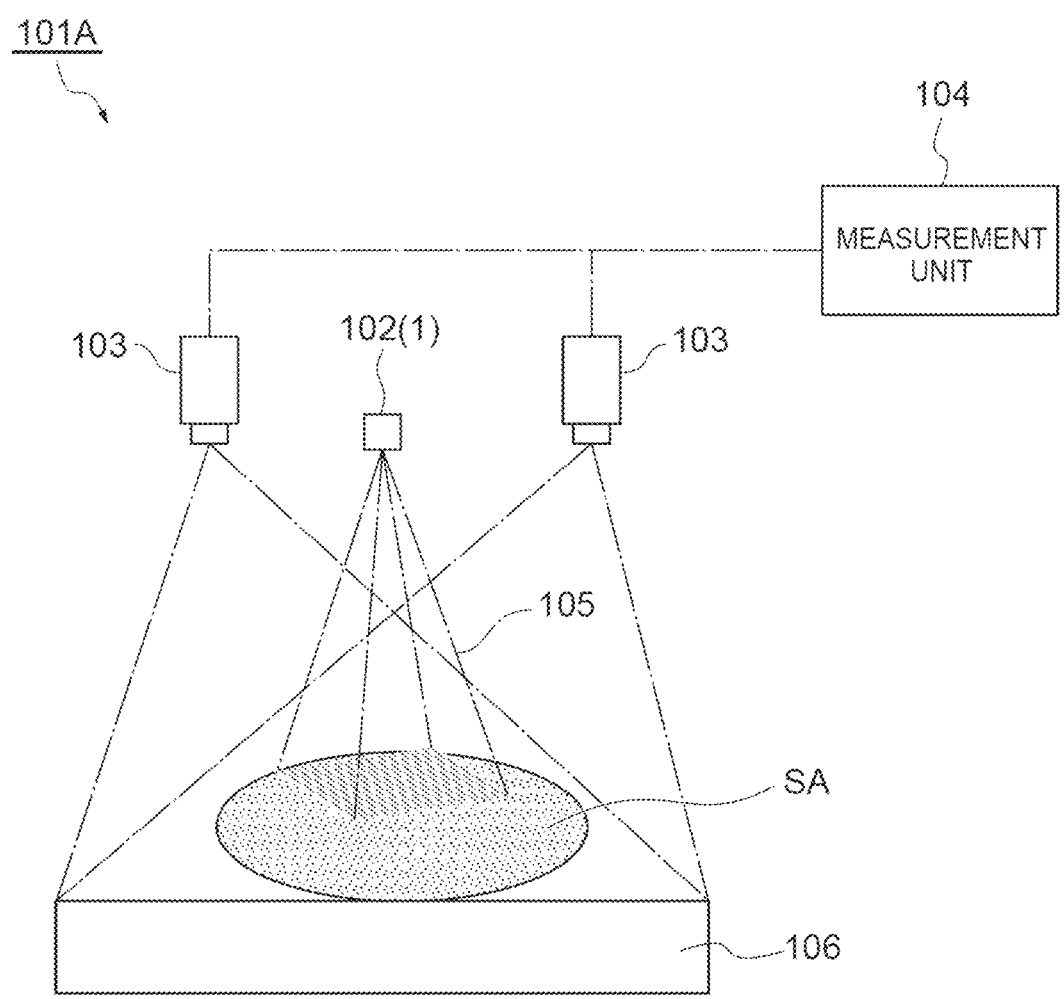
FIG. 15 is a schematic diagram illustrating a configuration of a three-dimensional measurement device according to a first embodiment.

A three-dimensional measurement device 101 according to the present embodiment is configured to include one or a plurality of light source units 102 that irradiate an object to be measured SA with measurement light 105 having a predetermined pattern, one or a plurality of image capture units 103 that capture an image of the object to be measured SA with which the measurement light 105 is irradiated, and a measurement unit 104 that measures a three-dimensional shape of the object to be measured SA on the basis of results of image capture performed by the image capture unit 103 (see FIG. 15 or the like). In addition, the light source unit 102 is constituted by a static-integrable phase modulating surface emitting laser (S-iPMSEL) 1 of M-point oscillation.

In the three-dimensional measurement device 101, the light source unit 102 is constituted using the S-iPMSEL 1 configured to have about the size of a needle tip, so that it is possible to reduce the size of the entire device, and to achieve the expansion of the application range of the device. In addition, in the three-dimensional measurement device 101, by using the S-iPMSEL 1 of M-point oscillation, it is possible to eliminate an output of 0-order light (a diffracted wave component which is not phase-modulated) different from the light image of a desired two-dimensional pattern. Thereby, it is possible to irradiate the object to be measured SA with the measurement light 105 having a pattern without noise or distortion caused by the 0-order light, and to achieve an improvement in the accuracy of measurement.

[S-iPMSEL of M-Point Oscillation]

Figure 1:
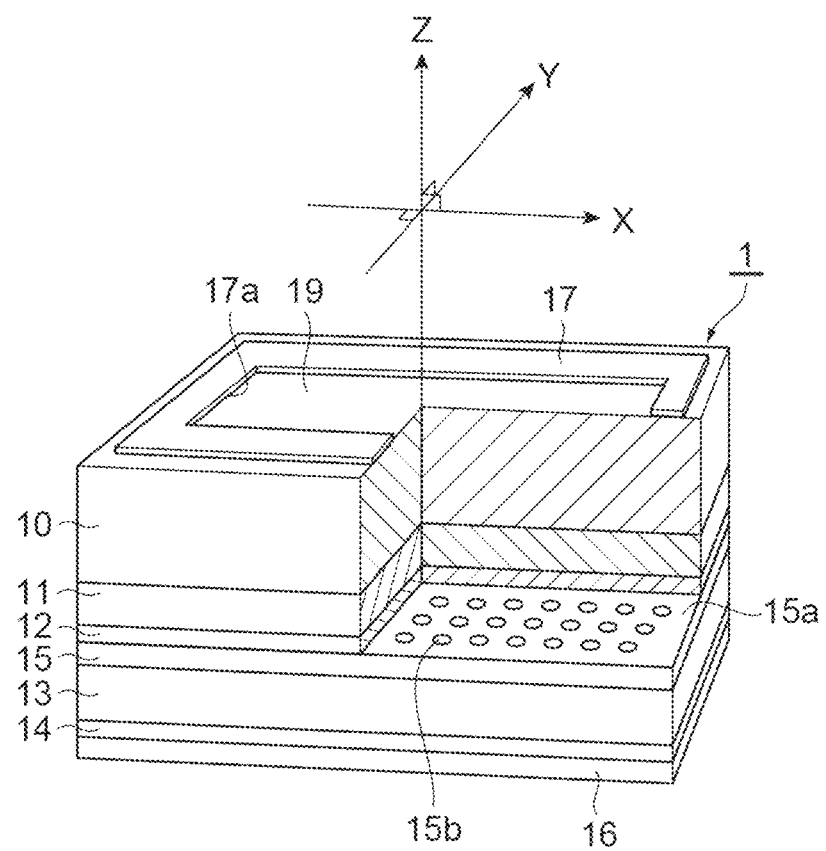
FIG. 1 is a partial cross-sectional perspective view illustrating a configuration of an S-iPMSEL.
Figure 2:
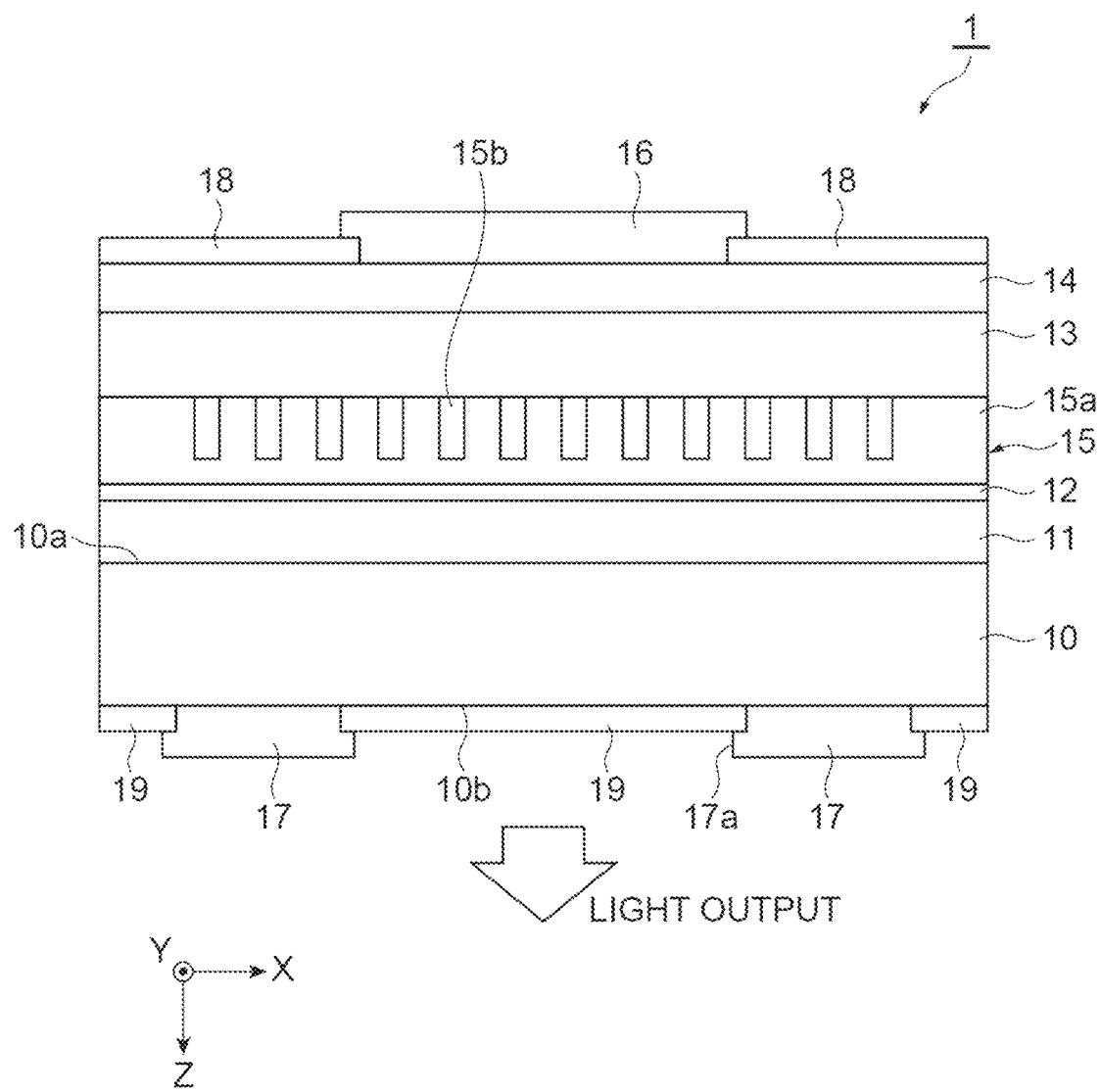
FIG. 2 is a cross-sectional view illustrating a laminated structure of the S-iPMSEL.

First, the S-iPMSEL 1 of M-point oscillation will be described. FIG. 1 is a partial cross-sectional perspective view illustrating a configuration of the S-iPMSEL. FIG. 2 is a cross-sectional view illustrating a laminated structure of the S-iPMSEL. In FIG. 1, an XYZ orthogonal coordinate system is defined with an axis extending in the thickness direction of the S-iPMSEL 1 as a Z axis at the center of the S-iPMSEL 1.

The S-iPMSEL 1 is a laser light source that forms standing waves in an XY in-plane direction and outputs phase-controlled plane waves in a Z-axis direction. The S-iPMSEL 1 outputs a light image having an arbitrary two-dimensional shape including a direction perpendicular to a main surface 10a of a semiconductor substrate 10 (that is, the Z-axis direction), a direction inclined with respect to the main surface, or both directions.

As shown in FIGS. 1 and 2, the S-iPMSEL 1 includes an active layer 12 as a light-emitting unit provided on the semiconductor substrate 10, a pair of cladding layers 11 and 13 interposing the active layer 12, and a contact layer 14 provided on the cladding layer 13. The semiconductor substrate 10, the cladding layers 11 and 13, and the contact layer 14 are constituted of compound semiconductors such as, for example, a GaAs-based semiconductor, an InP-based semiconductor, or a nitride-based semiconductor. The energy bandgap of the cladding layer 11 and the energy bandgap of the cladding layer 13 are larger than the energy bandgap of the active layer 12. The thickness direction of the semiconductor substrate 10 and each of the layers 11 to 14 coincides with the Z-axis direction.

The S-iPMSEL 1 further includes a phase modulation layer 15 which is the optically coupled to active layer 12. In the present embodiment, the phase modulation layer 15 is provided between the active layer 12 and the cladding layer 13. The thickness direction of the phase modulation layer 15 coincides with the Z-axis direction. The phase modulation layer 15 may be provided between the cladding layer 11 and the active layer 12. A light guide layer may be provided as necessary in at least one location between the active layer 12 and the cladding layer 13 or between the active layer 12 and the cladding layer 11. The light guide layer may include a carrier barrier layer for efficiently confining carriers in the active layer 12.

The phase modulation layer 15 is configured to include a fundamental layer 15a which is formed of a medium having a first refractive index and a plurality of different refractive index regions 15b which are formed of a medium having a second refractive index different from the refractive index of the medium having the first refractive index and are present within the fundamental layer 15a. The plurality of different refractive index regions 15b include an approximately periodic structure. In a case where the equivalent refractive index of a mode is set to n, a wavelength $\lambda 0 (=(\sqrt{2})a \times n$; a is a lattice spacing) selected by the phase modulation layer 15 is included in the emission wavelength range of the active layer 12. The phase modulation layer 15 can be configured to select a band edge wavelength in the vicinity of the wavelength 20 out of the emission wavelengths of the active layer 12 and to output it to the outside. A laser beam that enters the phase modulation layer 15 forms a predetermined mode according to the arrangement of the different refractive index regions 15b within the phase modulation layer 15, and is emitted from the surface of the S-iPMSEL 1 to the outside as a laser beam having a desired pattern.

The S-iPMSEL 1 further includes an electrode 16 provided on the contact layer 14 and an electrode 17 provided on a rear surface 10b of the semiconductor substrate 10. The electrode 16 is in ohmic contact with the contact layer 14, and the electrode 17 is in ohmic contact with the semiconductor substrate 10. The electrode 17 has an opening 17a. The electrode 16 is provided in the central region of the contact layer 14. Portions on the contact layer 14 other than the electrode 16 are covered with a protective film 18 (see FIG. 2). The contact layer 14 which is not in contact with the electrode 16 may be removed in order to limit a current range. Portions on the rear surface 10b of the semiconductor substrate 10 other than the electrode 17 are covered with an antireflection film 19 inclusive of the inside of the opening 17a. The antireflection film 19 present in regions other than the opening 17a may be removed.

In the S-iPMSEL 1, when a driving current is supplied between the electrode 16 and the electrode 17, the recombination of electrons and holes occurs within the active layer 12, and the active layer 12 emits light. The electrons, holes, and light generated in the active layer 12 which contribute to this light emission are efficiently trapped between the cladding layer 11 and the cladding layer 13.

The light emitted from the active layer 12 enters the phase modulation layer 15, and forms a predetermined mode according to a lattice structure inside the phase modulation layer 15. The laser beam emitted from the phase modulation layer 15 is directly output from the rear surface 10b through the opening 17a to the outside of the S-iPMSEL 1. Alternatively, the laser beam emitted from the phase modulation layer 15 is reflected from the electrode 16, and then is output from the rear surface 10b through the opening 17a to the outside of the S-iPMSEL 1. In this case, signal light (the measurement light 105) included in the laser beam is emitted in an arbitrary two-dimensional direction including a direction perpendicular to the main surface 10a or a direction inclined with respect to this direction. A desired light image is formed by this signal light. The signal light is mainly 1-order light and −1-order light of the laser beam. The 0-order light of the laser beam is not output from the phase modulation layer 15 of the present embodiment.

Figure 3:
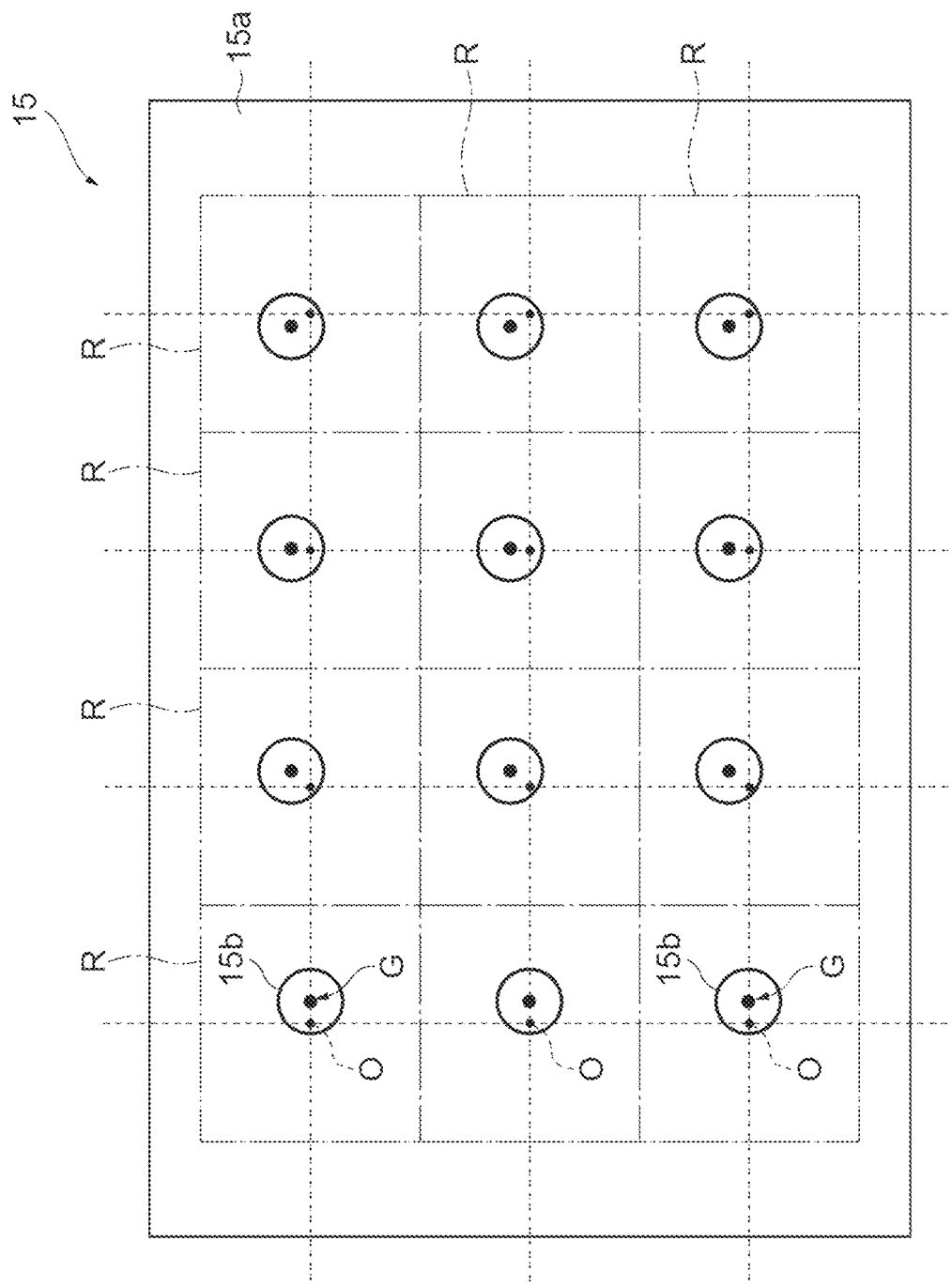
FIG. 3 is a plan view of a phase modulation layer.

FIG. 3 is a plan view of the phase modulation layer 15. As shown in the drawing, the phase modulation layer 15 includes the fundamental layer 15a which is formed of the medium having the first refractive index and the plurality of different refractive index regions 15b which are formed of the medium having the second refractive index different from the refractive index of the medium having the first refractive index. In FIG. 3, a virtual square lattice in an XY plane is set with respect to the phase modulation layer 15. One side of the square lattice is parallel to the X axis, and the other side is parallel to the Y axis. Square-shaped unit configuration regions R centering on a lattice point O of the square lattice are set two-dimensionally over multiple rows along the X axis and multiple columns along the Y axis. In a case where the XY coordinates of each unit configuration region R are defined as the position of the center of gravity of the unit configuration region R, the position of the center of gravity coincides with the lattice point O of the virtual square lattice. The plurality of different refractive index regions 15b are provided, for example, one by one within each unit configuration region R. The planar shapes of the different refractive index regions 15b are, for example, circular. The lattice point O may be located outside the different refractive index regions 15b, or may be located inside the different refractive index regions 15b.

The ratio of an area S of the different refractive index region 15b to one unit configuration region R is referred to as a filling factor (FF). In a case where the lattice spacing of the square lattice is set to a, the filling factor FF of the different refractive index region 15b is given as $S/a^2$. S is the area of the different refractive index region 15b in the XY plane. For example, in a case where the shape of the different refractive index region 15b is perfectly circular, the filling factor FF is given as $S=\pi(d/2)2$ using the diameter d of a perfect circle. In a case where the shape of the different refractive index region 15b is square, the filling factor FF is given as $S=LA2$ using the length LA of one side having a square shape.

Figure 4:
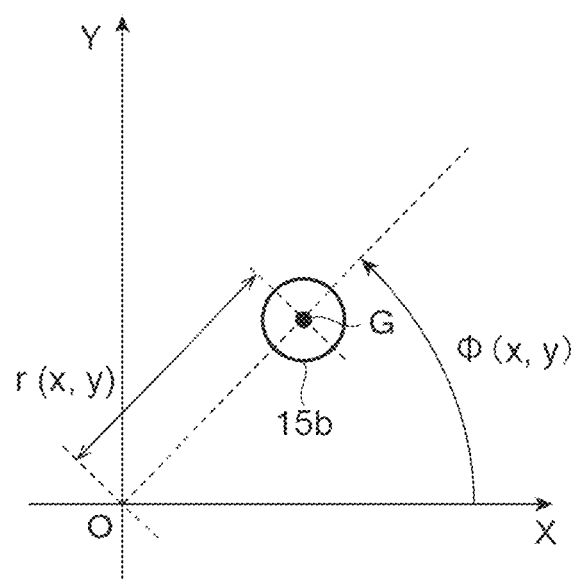
FIG. 4 is an enlarged view illustrating a unit configuration region R.

FIG. 4 is an enlarged view illustrating the unit configuration region R. As shown in the drawing, each of the different refractive index regions 15b has the center of gravity G. Here, an angle between a vector toward the center of gravity G from the lattice point O and the X axis is referred to as $\varphi(x, y)$. Here, x represents the position of an x-th lattice point on the X axis, and y represents the position of a y-th lattice point on the Y axis. In a case where the rotation angle φ is 0°, the direction of the vector that links the lattice point O to the center of gravity G coincides with the forward direction of the X axis. In addition, the length of the vector that links the lattice point O to the center of gravity G is referred to as r(x, y). In an example, r(x, y) is constant over the entire phase modulation layer 15 regardless of x and y.

As shown in FIG. 3, the direction of the vector that links the lattice point O to the center of gravity G, that is, the rotation angle φ around the lattice point O of the center of gravity G of the different refractive index region 15b, is individually set for each lattice point O in accordance with a phase pattern corresponding to a desired light image. The phase pattern, that is, the rotation angle distribution φ(x, y), has a specific value for each position which is determined by the values of x and y, but is not necessarily represented by a specific function. The rotation angle distribution φ(x, y) is determined from a phase distribution extracted in a complex amplitude distribution obtained by performing a Fourier transform on a desired light image. When the complex amplitude distribution is obtained from the desired light image, the reproducibility of a beam pattern can be improved by applying an iterative algorithm such as a Gerchberg-Saxton (GS) method which is generally used during the calculation of hologram generation.

Figure 5:
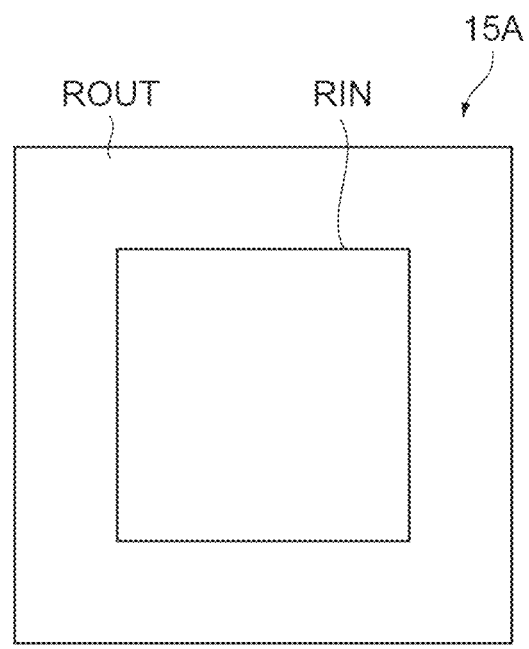
FIG. 5 is a plan view illustrating an example in which a structure with an approximately periodic refractive index is applied within a specific region of the phase modulation layer.

FIG. 5 is a plan view illustrating an example in which a structure with an approximately periodic refractive index is applied within a specific region of the phase modulation layer. In the example shown in FIG. 5, an approximately periodic structure (for example, a structure shown in FIG. 3) for emitting an objective beam pattern is formed inside an inside region RIN having a square shape. On the other hand, in an outside region ROUT surrounding the inside region RIN, a perfectly circular different refractive index region having the same position of the center of gravity is disposed at the lattice point position of the square lattice. The filling factor FF in the outside region ROUT is set, for example, to 12%. In the inside of the inside region RIN and the outside region ROUT, the lattice spacings between the square lattices which are virtually set are the same (=a) as each other. In the case of such a structure, since light is also distributed in the outside region ROUT, it is possible to suppress the generation of high-frequency noise (so-called window function noise) occurring due to a drastic change in light intensity in the peripheral portion of the inside region RIN. In addition, it is possible to suppress light leakage in an in-plane direction, and to expect a reduction in a threshold current.

Figure 6:
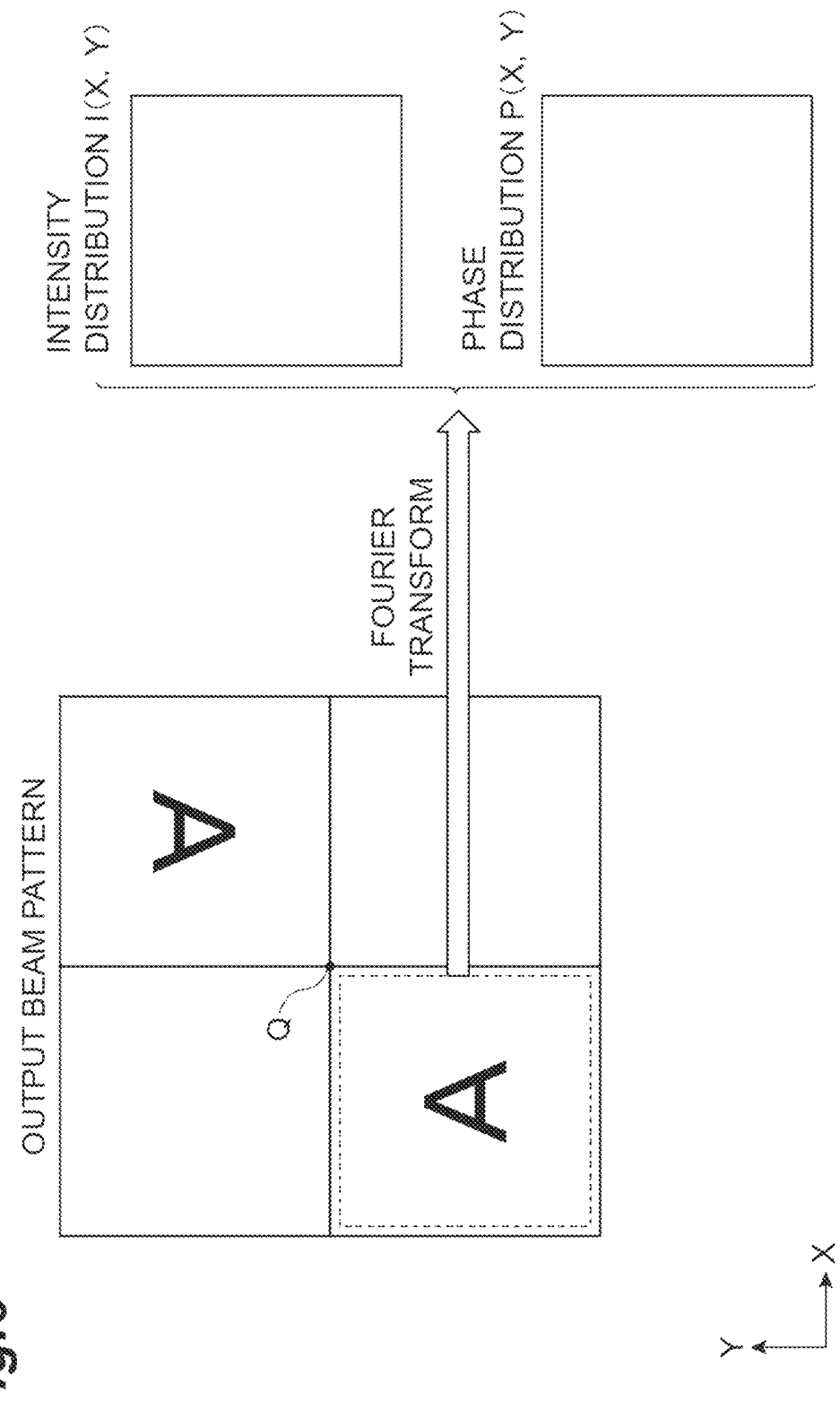
FIG. 6 is a diagram illustrating a relationship between a light image obtained by imaging an output beam pattern of the S-iPMSEL and a rotation angle distribution in the phase modulation layer.
Figure 14:
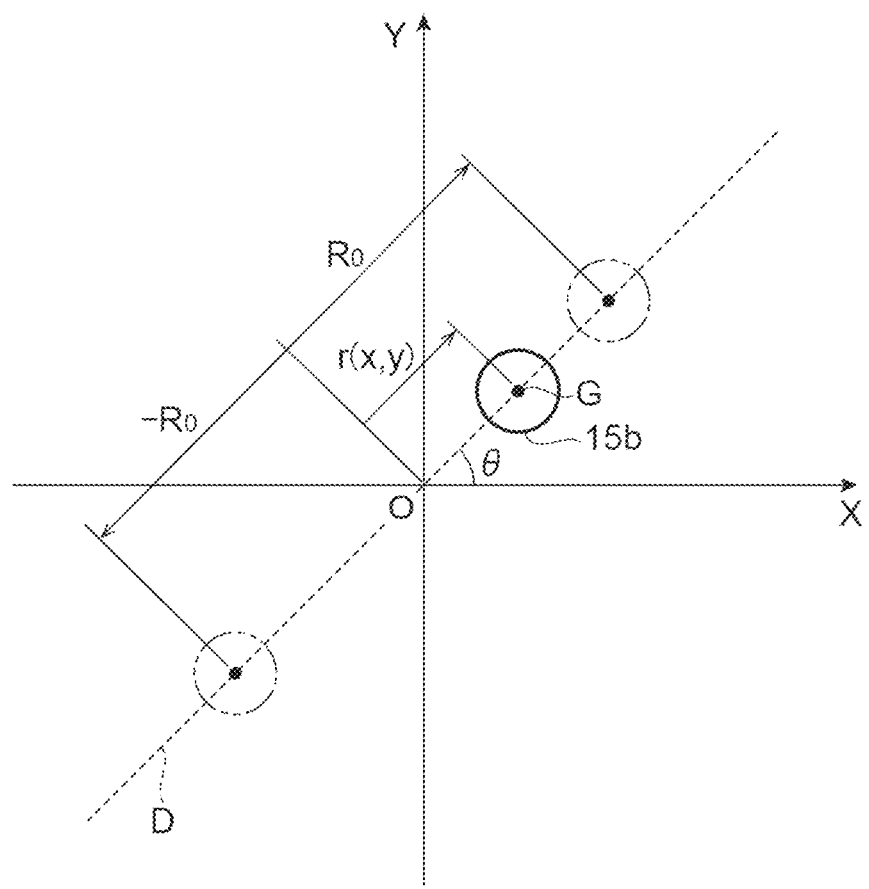
FIG. 14 is a diagram illustrating a positional relationship between different refractive index regions in the phase modulation layer according to the modification example.

FIG. 6 is a diagram illustrating a relationship between a light image obtained by imaging an output beam pattern of the S-iPMSEL 1 and the rotation angle distribution φ(x, y) in the phase modulation layer 15. The center Q of the output beam pattern is not necessarily located on an axis perpendicular to the main surface 10a of the semiconductor substrate 10, but it can also be disposed on the axis perpendicular thereto. In FIG. 6, for convenience of description, the center Q is assumed to be located on the axis perpendicular to the main surface 10a. FIG. 6 shows four quadrants with the center Q as the origin. In the example of FIG. 6, the letter "A" appears in the third quadrant, and the letter "A" rotated 180 degrees appears in the first quadrant. In a case where output beam patterns are a rotationally symmetric light image (such as, for example, a cross, a circle, or a double circle), they overlap each other and are observed as one light image. In a case where the center of gravity G of the different refractive index region 15b in the S-iPMSEL 1 is shifted in a circumferential direction around the lattice point O as shown in FIG. 4, there is no intensity difference between the output beam pattern of the first quadrant and the output beam pattern of the third quadrant as shown in FIG. 6. However, in a case where the center of gravity G of the different refractive index region 15b in the S-iPMSEL 1 is shifted onto a straight line through the lattice point O as shown in FIG. 14 to be described later, it is possible to allow an intensity difference between the output beam pattern of the first quadrant and the output beam pattern of the third quadrant.

The light image of the output beam pattern of the S-iPMSEL 1 includes at least one of a spot, a dot, a straight line, a cross, a line drawing, a lattice pattern, a photograph, a stripe-like pattern, computer graphics (CG), and text. In order to obtain a desired light image, the rotation angle distribution φ(x, y) of the different refractive index region 15b in the phase modulation layer 15 is determined by the following procedure.

As a first precondition, in the XYZ orthogonal coordinate system defined by the Z axis coinciding with a normal direction and the X-Y plane coinciding with one surface of the phase modulation layer 15 including the plurality of different refractive index regions 15b, the virtual square lattice constituted by M1 (an integer equal to or greater than 1)×N1 (an integer equal to or greater than 1) unit configuration regions R having a square shape is set on the X-Y plane.

Figure 7:
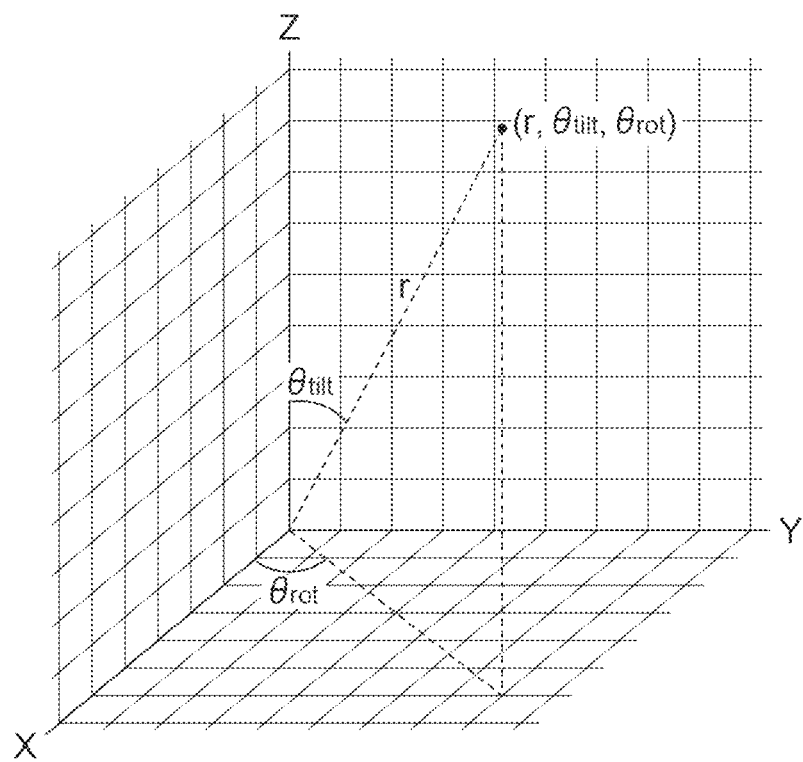
FIG. 7 is a diagram illustrating a coordinate transformation from spherical coordinates to coordinates in an XYZ orthogonal coordinate system.

As a second precondition, as shown in FIG. 7, coordinates (ξ, η, ζ) in the XYZ orthogonal coordinate system are assumed to satisfy relations shown in the following Expressions (1) to (3) with respect to spherical coordinates (r, θrot, θtilt) defined by a radial length r, an inclination angle θtilt from the Z axis, and a rotation angle θrot from the X axis specified on the X-Y plane. FIG. 7 is a diagram illustrating a coordinate transformation from the spherical coordinates (r, θrot, θtilt) to the coordinates (ξ, η, ζ) in the XYZ orthogonal coordinate system, and a light image according to a design on a predetermined plane which is set in the XYZ orthogonal coordinate system that is a real space is represented by the coordinates (ξ, η, ζ).

When a beam pattern equivalent to a light image which is output from the S-iPMSEL 1 is defined as a set of bright spots toward a direction specified by the angles θtilt and θrot, the angles θtilt and θrot are assumed to be converted into a coordinate value kx on a Kx axis corresponding to the X axis which is a normalized wavenumber defined in the following Expression (4) and a coordinate value ky on a Ky axis corresponding to the Y axis and orthogonal to the Kx axis which is a normalized wavenumber defined in the following Expression (5). The normalized wavenumber is a wavenumber in which a wavenumber 2π/a equivalent to the lattice spacing of the virtual square lattice is standardized as 1.0. In this case, in a wavenumber space which is defined by the Kx axis and the Ky axis, specific wavenumber ranges including a beam pattern equivalent to a light image are each constituted by M2 (an integer equal to or greater than 1)×N2 (an integer equal to or greater than 1) image regions FR having a square shape. The integer M2 does not have to coincide with the integer M1. Similarly, the integer N2 does not have to coincide with the integer N1. Expressions (4) and (5) are disclosed in, for example, Y. Kurosaka et al., "Effects of non-lasing band in two-dimensionalphotoniccrystal lasers clarified using omnidirectional band structure," Opt. Express 20, 21773-21783 (2012).

$$\xi = r\sin\theta_{tilt}\cos\theta_{rot} \quad (1)$$

$$\eta = r\sin\theta_{tilt}\sin\theta_{rot} \quad (2)$$

$$\zeta = r\cos\theta_{tilt} \quad (3)$$

$$k_x = \frac{a}{\lambda}\sin\theta_{tilt}\cos\theta_{rot} \quad (4)$$

$$k_y = \frac{a}{\lambda}\sin\theta_{tilt}\sin\theta_{rot} \quad (5)$$

a: the lattice constant of the virtual square lattice
λ: the oscillation wavelength of the S-iPMSEL 1

As a third precondition, in the wavenumber space, a complex amplitude F(x, y) obtained by performing a two-dimensional inverse discrete Fourier transform on each image region FR (kx, ky) specified by a coordinate component kx (an integer between 0 and M2-1) in a Kx-axis direction and a coordinate component ky (an integer between 0 and N2-1) in a Ky-axis direction into the unit configuration region R(x, y) on the X-Y plane specified by a coordinate component x (an integer between 0 and M1-1) in an X-axis direction and a coordinate component y (an integer between 0 and N1-1) in a Y-axis direction is given by the following Expression (6) with j as an imaginary unit. The complex amplitude F(x, y) is defined by the following Expression (7) when the amplitude term is A (x, y) and the phase term is P(x, y). As a fourth precondition, the unit configuration region R(x, y) is defined by an s axis and a t axis which are parallel to the X axis and the Y axis, respectively, and are orthogonal to each other at the lattice point O(x, y) that is the center of the unit configuration region R(x, y).

$$F(x, y) = \sum_{k_x=0}^{M2-1}\sum_{k_y=0}^{N2-1} FR(k_x, k_y)\exp\left[j2\pi\left(\frac{k_x}{M2}x + \frac{k_y}{N2}y\right)\right] \quad (6)$$

$$F(x, y) = A(x, y) \times \exp[jP(x, y)] \quad (7)$$

Under the first to fourth preconditions, the phase modulation layer 15 is configured to satisfy the following fifth condition and sixth condition. That is, the fifth condition is satisfied by the center of gravity G being disposed away from the lattice point O(x, y) within the unit configuration region R(x, y). The sixth condition is satisfied by a corresponding different refractive index region 15b being disposed within the unit configuration region R(x, y) so that an angle φ(x, y) between the s axis and a segment that links the lattice point O(x, y) to the center of gravity G corresponding thereto satisfies the following relation in a state where a segment length r2(x, y) from the lattice point O(x, y) to the center of gravity G corresponding thereto is set to a common value in each of M1×N1 unit configuration regions R.

φ(x,y)=C×P(x,y)+B

C: a proportionality constant, for example, 180°/x
B: an arbitrary constant, for example, 0

Figure 8:
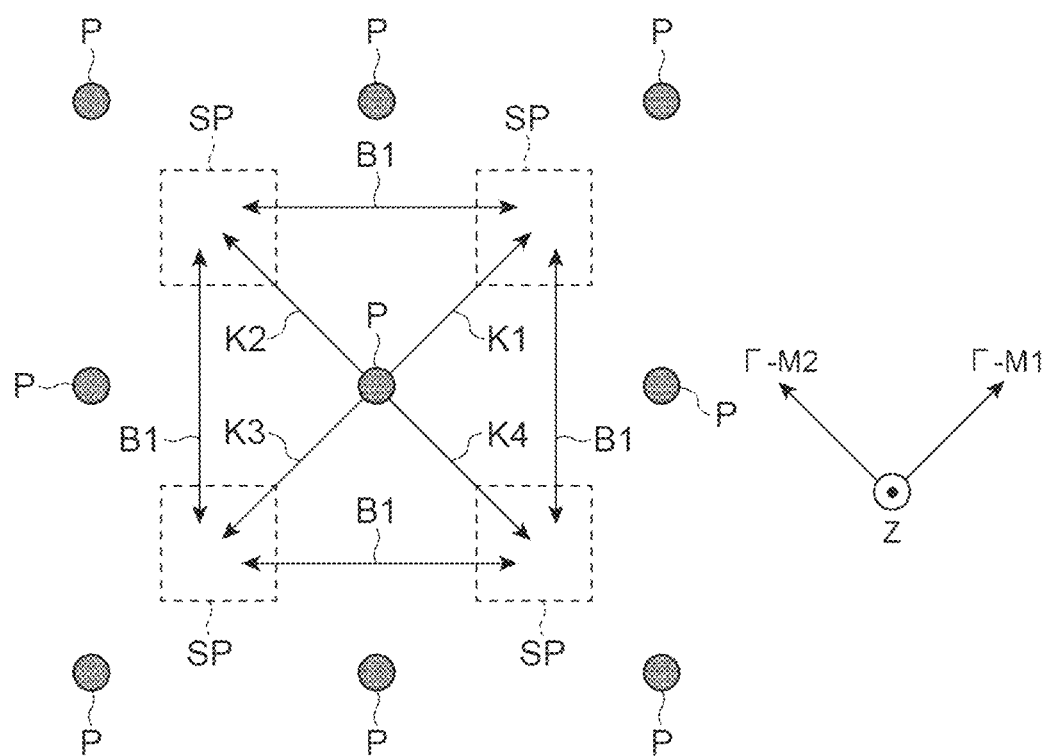
FIG. 8 is a plan view illustrating a reciprocal lattice space related to the phase modulation layer of the S-iPMSEL of M-point oscillation.

Next, the M-point oscillation of the S-iPMSEL 1 will be described. For the M-point oscillation of the S-iPMSEL 1, it is only required that the lattice spacing a of the virtual square lattice, the emission wavelength 2 of the active layer 12, and the equivalent refractive index n of a mode satisfy the condition of λ=(√2)n×a. FIG. 8 is a plan view illustrating a reciprocal lattice space related to the phase modulation layer of the S-iPMSEL of M-point oscillation. Points P in the drawing represent reciprocal lattice points. Arrows B1 in the drawing represent fundamental reciprocal lattice vectors, and arrows K1, K2, K3, and K4 represent four in-plane wavenumber vectors. The in-plane wavenumber vectors K1 to K4 have wavenumber spread SP according to the rotation angle distribution φ(x, y).

The shape and magnitude of the wavenumber spread SP are the same as those in the case of the above-described I-point oscillation. In the S-iPMSEL 1 of M-point oscillation, the magnitude of the in-plane wavenumber vectors K1 to K4 (that is, the magnitude of standing waves in an in-plane direction) is smaller than the magnitude of the fundamental reciprocal lattice vector B1. Therefore, since the vector sum of the in-plane wavenumber vectors K1 to K4 and the fundamental reciprocal lattice vector B1 is not set to 0 and the wavenumber in an in-plane direction cannot be set to 0 due to diffraction, diffraction in a direction perpendicular to the plane (the Z-axis direction) does not occur. As it is, in the S-iPMSEL 1 of M-point oscillation, 0-order light in the direction perpendicular to the plane (the Z-axis direction), and 1-order light and −1-order light in a direction inclined with respect to the Z-axis direction are not output.

Figure 9:
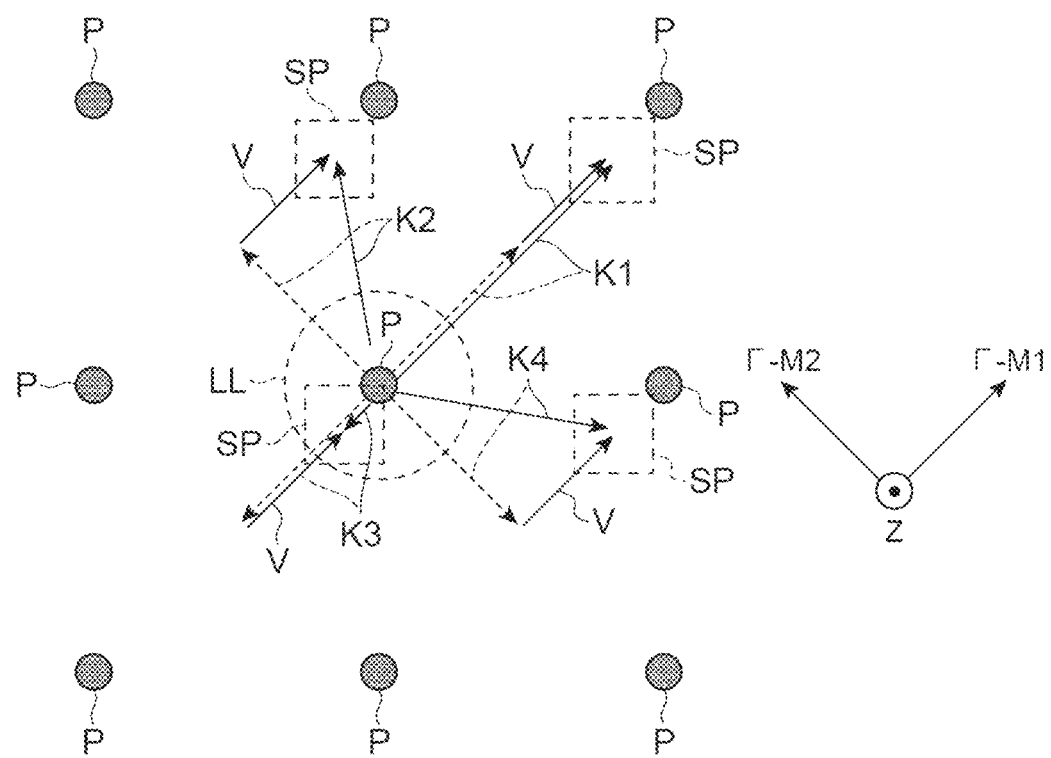
FIG. 9 is a conceptual diagram illustrating a state in which a diffraction vector is added to an in-plane wavenumber vector.

In the present embodiment, the following scheme is performed on the phase modulation layer 15 in the S-iPMSEL 1 of M-point oscillation, and thus some of the 1-order light and the −1-order light can be output without outputting the 0-order light. Specifically, as shown in FIG. 9, a diffraction vector V having a certain magnitude and direction is added to the in-plane wavenumber vectors K1 to K4, and thus the magnitude of at least one of the in-plane wavenumber vectors K1 to K4 (the in-plane wavenumber vector K3 in the drawing) is made smaller than 2π/λ. In other words, at least one of the in-plane wavenumber vectors K1 to K4 (the in-plane wavenumber vector K3) after the diffraction vector V is added is caused to fall within a circular region (light line) LL having a radius of 2π/λ.

The in-plane wavenumber vectors K1 to K4 shown by broken lines in FIG. 9 represent vectors before the addition of the diffraction vector V, and the in-plane wavenumber vectors K1 to K4 shown by solid lines represent vectors after the addition of the diffraction vector V. The light line LL corresponds to a total reflection condition, and the wavenumber vector having a magnitude which falls within the light line LL has a component in the direction perpendicular to the plane (the Z-axis direction). In an example, the direction of the diffraction vector V is along Γ-M1 axis or a Γ-M2 axis. The magnitude of the diffraction vector V is in the range of 2π/(√2)a−2π/λ to 2π/(√2)a+2π/λ. As an example, the magnitude of the diffraction vector V is 2π/(√2) a.

Subsequently, the magnitude and direction of the diffraction vector V for causing at least one of the in-plane wavenumber vectors K1 to K4 to fall within the light line LL will be examined. The following Expressions (8) to (11) represent the in-plane wavenumber vectors K1 to K4 before the diffraction vector V is added.

$$K1 = \left(\frac{\pi}{a} + \Delta kx, \frac{\pi}{a} + \Delta ky\right) \quad (8)$$

$$K2 = \left(-\frac{\pi}{a} + \Delta kx, \frac{\pi}{a} + \Delta ky\right) \quad (9)$$

-continued $$K3 = \left(-\frac{\pi}{a} + \Delta kx, -\frac{\pi}{a} + \Delta ky\right) \quad (10)$$

$$K4 = \left(\frac{\pi}{a} + \Delta kx, -\frac{\pi}{a} + \Delta ky\right) \quad (11)$$

The spreads $\Delta kx$ and $\Delta ky$ of the wavenumber vector satisfy the following Expressions (12) and (13), respectively. The maximum value $\Delta kx_{max}$ of spread of the in-plane wavenumber vector in the x-axis direction and the maximum value $\Delta ky_{max}$ of spread thereof in the y-axis direction are defined by the angle spread of the light image of a design.

$$-\Delta kx_{max} \leq \Delta kx \leq \Delta kx_{max} \quad (12)$$

$$-\Delta ky_{max} \leq \Delta ky \leq \Delta ky_{max} \quad (13)$$

When the diffraction vector V is represented as in the following Expression (14), the in-plane wavenumber vectors K1 to K4 after the diffraction vector V is added become the following Expressions (15) to (18).

$$V = (Vx, Vy) \quad (14)$$

$$K1 = \left(\frac{\pi}{a} + \Delta kx + Vx, \frac{\pi}{a} + \Delta ky + Vy\right) \quad (15)$$

$$K2 = \left(-\frac{\pi}{a} + \Delta kx + Vx, \frac{\pi}{a} + \Delta ky + Vy\right) \quad (16)$$

$$K3 = \left(-\frac{\pi}{a} + \Delta kx + Vx, -\frac{\pi}{a} + \Delta ky + Vy\right) \quad (17)$$

$$K4 = \left(\frac{\pi}{a} + \Delta kx + Vx, -\frac{\pi}{a} + \Delta ky + Vy\right) \quad (18)$$

Considering that any of the wavenumber vectors K1 to K4 falls within the light line LL in Expressions (15) to (18), the relation of the following Expression (19) is established.

$$\left(\pm\frac{\pi}{a} + \Delta kx + Vx\right)^2 + \left(\pm\frac{\pi}{a} + \Delta ky + Vy\right)^2 < \left(\frac{2\pi}{\lambda}\right)^2 \quad (19)$$

That is, any of the wavenumber vectors K1 to K4 falls within the light line LL when the diffraction vector V satisfying Expression (19) is added, and some of the 1-order light and the −1-order light is output.

Figure 10:
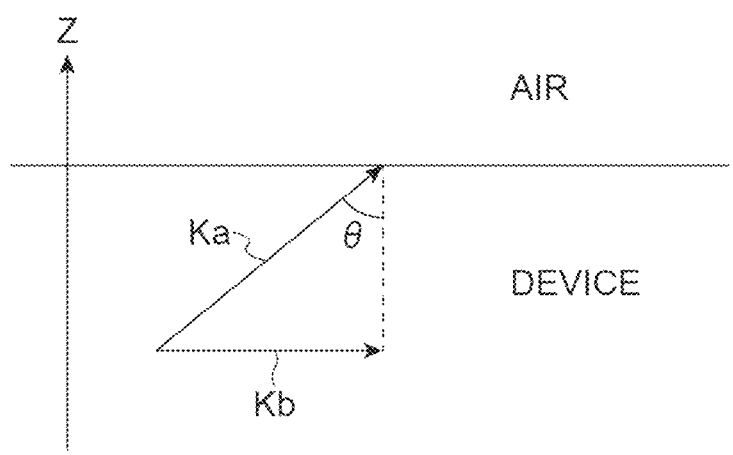
FIG. 10 is a diagram schematically illustrating a peripheral structure of a light line.

The magnitude (radius) of the light line LL is set to $2\pi/\lambda$ for the following reason. FIG. 10 is a diagram schematically illustrating a peripheral structure of the light line LL. The drawing shows a boundary between the device and the air viewed from a direction perpendicular to the Z-axis direction. The magnitude of the wavenumber vector of light in a vacuum is $2\pi/\lambda$, but when light propagates through a device medium as shown in FIG. 10, the magnitude of a wavenumber vector Ka in the medium having a refractive index n is $2\pi n/\lambda$. In this case, in order for light to propagate through the boundary between the device and the air, a wavenumber component parallel to the boundary is required to be continuous (wavenumber conservation law).

In FIG. 10, in a case where the wavenumber vector Ka and the Z axis form an angle θ, the length of a wavenumber vector (that is, an in-plane wavenumber vector) Kb projected into the plane is $(2\pi n/\lambda)$ sine. On the other hand, generally, from the relation of the refractive index n of a medium >1, the wavenumber conservation law is not established at an angle where the in-plane wavenumber vector Kb in the medium is larger than $2\pi/\lambda$. In this case, the light is totally reflected, and cannot be taken out to the air side. The magnitude of a wavenumber vector corresponding to this total reflection condition is the magnitude of the light line LL, that is, $2\pi/\lambda$.

As an example of a specific method of adding the diffraction vector V to the in-plane wavenumber vectors K1 to K4, a method of superimposing a rotation angle distribution φ2(x, y) (second phase distribution) irrelevant to the light image on a rotation angle distribution φ1(x, y) (first phase distribution) which is a phase distribution according to the light image can be considered. In this case, the rotation angle distribution φ(x, y) of the phase modulation layer 15 is represented as φ(x, y)=φ1(x,y)+φ2(x, y). Here, φ1(x, y) is equivalent to the phase of a complex amplitude when a Fourier transform is performed on the light image as described above. In addition, φ2(x, y) is a rotation angle distribution for adding the diffraction vector V satisfying Expression (19) stated above.

FIG. 11 is a diagram conceptually illustrating an example of the rotation angle distribution φ2(x, y). In the example of the drawing, a first phase value φA and a second phase value φB which is a value different from the first phase value φA are arrayed in a checkered pattern. In an example, the phase value φA is 0(rad), and the phase value φB is π (rad). In this case, the first phase value φA and the second phase value φB change by π. With such an array of the phase values, it is possible to suitably realize the diffraction vector V along the Γ-M1 axis or the Γ-M2 axis. In the case of a checkered array, the relation of V=(±π/a, ±π/a) is established, and the diffraction vector V and the wavenumber vectors K1 to K4 in FIG. 8 are just offset. The angle distribution θ2(x, y) of the diffraction vector V is represented by an inner product of the diffraction vector V(Vx, Vy) and a position vector r(x, y). That is, the angle distribution θ2(x, y) of the diffraction vector V is represented by θ2(x, y)=V·r=Vxx+Vyy.

In the above embodiment, in a case where the wavenumber spread based on the angle spread of the light image is included in a circle with a radius Δk centering on a certain point in the wavenumber space, the following can also be considered simply. The diffraction vector V is added to the in-plane wavenumber vectors K1 to K4 in four directions, and thus the magnitude of at least one of the in-plane wavenumber vectors K1 to K4 in four directions is made smaller than $2\pi/\lambda$ (the light line LL). This may mean that by adding the diffraction vector V to vectors obtained by excluding the wavenumber spread Δk from the in-plane wavenumber vectors K1 to K4 in four directions, the magnitude of at least one of the in-plane wavenumber vectors K1 to K4 in four directions is made smaller than a value {$(2\pi/\lambda)$−Δk} obtained by subtracting the wavenumber spread Δk from $2\pi/\lambda$.

Figure 12:
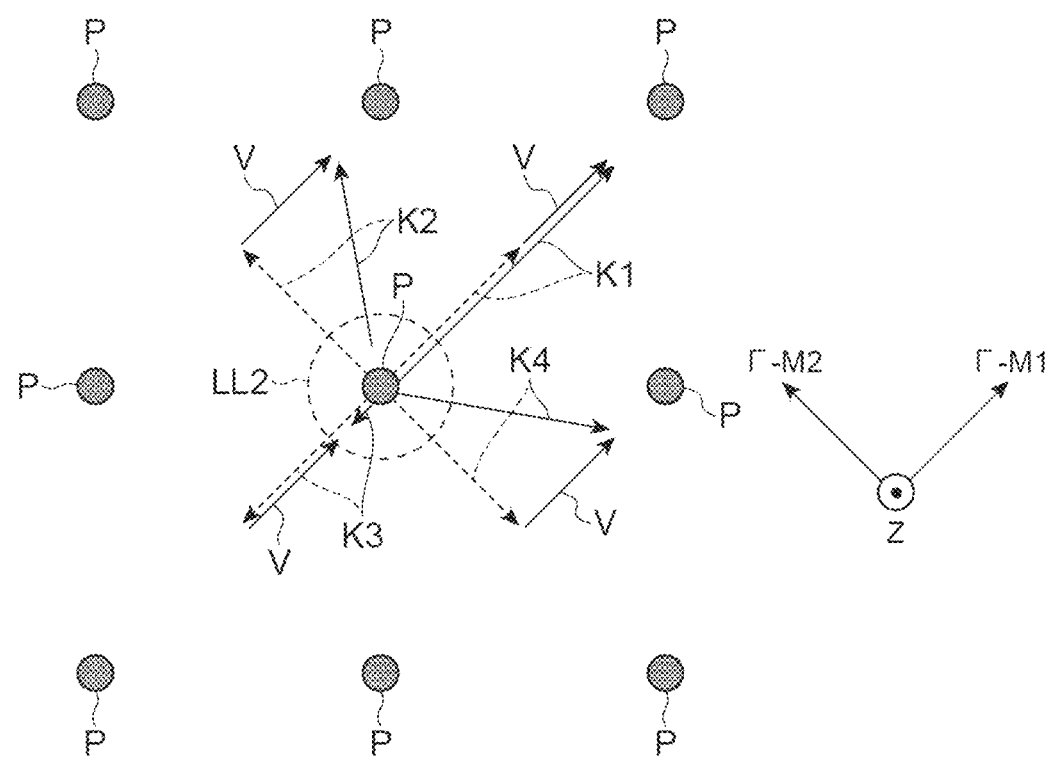
FIG. 12 is a conceptual diagram illustrating a state in which a diffraction vector is added to a vector obtained by excluding wavenumber spread from an in-plane wavenumber vector in a direction.

FIG. 12 is a diagram conceptually illustrating the above state. As shown in the drawing, when the diffraction vector V is added to the in-plane wavenumber vectors K1 to K4 excluding the wavenumber spread Δk, the magnitude of at least one of the in-plane wavenumber vectors K1 to K4 becomes smaller than {$(2\pi/\lambda)$−Δk}. In FIG. 12, a region LL2 is a circular region having a radius of {$(2\pi/\lambda)$−Δk}. In FIG. 12, the in-plane wavenumber vectors K1 to K4 shown by broken lines represent vectors before the addition of the diffraction vector V, and the in-plane wavenumber vectors K1 to K4 shown by solid lines represent vectors after the addition of the diffraction vector V. The region LL2 corresponds to a total reflection condition considering the wavenumber spread Δk, and the wavenumber vector having a magnitude which falls within the region LL2 also propagates in the direction perpendicular to the plane (the Z-axis direction).

In the present embodiment, the magnitude and direction of the diffraction vector V for causing at least one of the in-plane wavenumber vectors K1 to K4 to fall within the region LL2 will be described. The following Expressions (20) to (23) represent the in-plane wavenumber vectors K1 to K4 before the diffraction vector V is added.

$$K1 = \left(\frac{\pi}{a}, \frac{\pi}{a}\right) \quad (20)$$

$$K2 = \left(-\frac{\pi}{a}, \frac{\pi}{a}\right) \quad (21)$$

$$K3 = \left(-\frac{\pi}{a}, -\frac{\pi}{a}\right) \quad (22)$$

$$K4 = \left(\frac{\pi}{a}, -\frac{\pi}{a}\right) \quad (23)$$

Here, when the diffraction vector V is represented as in Expression (14) stated above, the in-plane wavenumber vectors K1 to K4 after the diffraction vector V is added become the following Expressions (24) to (27).

$$K1 = \left(\frac{\pi}{a} + Vx, \frac{\pi}{a} + Vy\right) \quad (24)$$

$$K2 = \left(-\frac{\pi}{a} + Vx, \frac{\pi}{a} + Vy\right) \quad (25)$$

$$K3 = \left(-\frac{\pi}{a} + Vx, -\frac{\pi}{a} + Vy\right) \quad (26)$$

$$K4 = \left(\frac{\pi}{a} + Vx, -\frac{\pi}{a} + Vy\right) \quad (27)$$

Considering that any of the in-plane wavenumber vectors K1 to K4 falls within the region LL2 in Expressions (24) to (27), the relation of the following Expression (28) is established. That is, any of the in-plane wavenumber vectors K1 to K4 excluding the wavenumber spread Δk falls within the region LL2 by adding the diffraction vector V satisfying Expression (28). Even in such a case, some of the 1-order light and the −1-order light can be output without outputting the 0-order light.

$$\left(\pm\frac{\pi}{a} + Vx\right)^2 + \left(\pm\frac{\pi}{a} + Vy\right)^2 < \left(\frac{2\pi}{\lambda} - \Delta k\right)^2 \quad (28)$$

Figure 13:
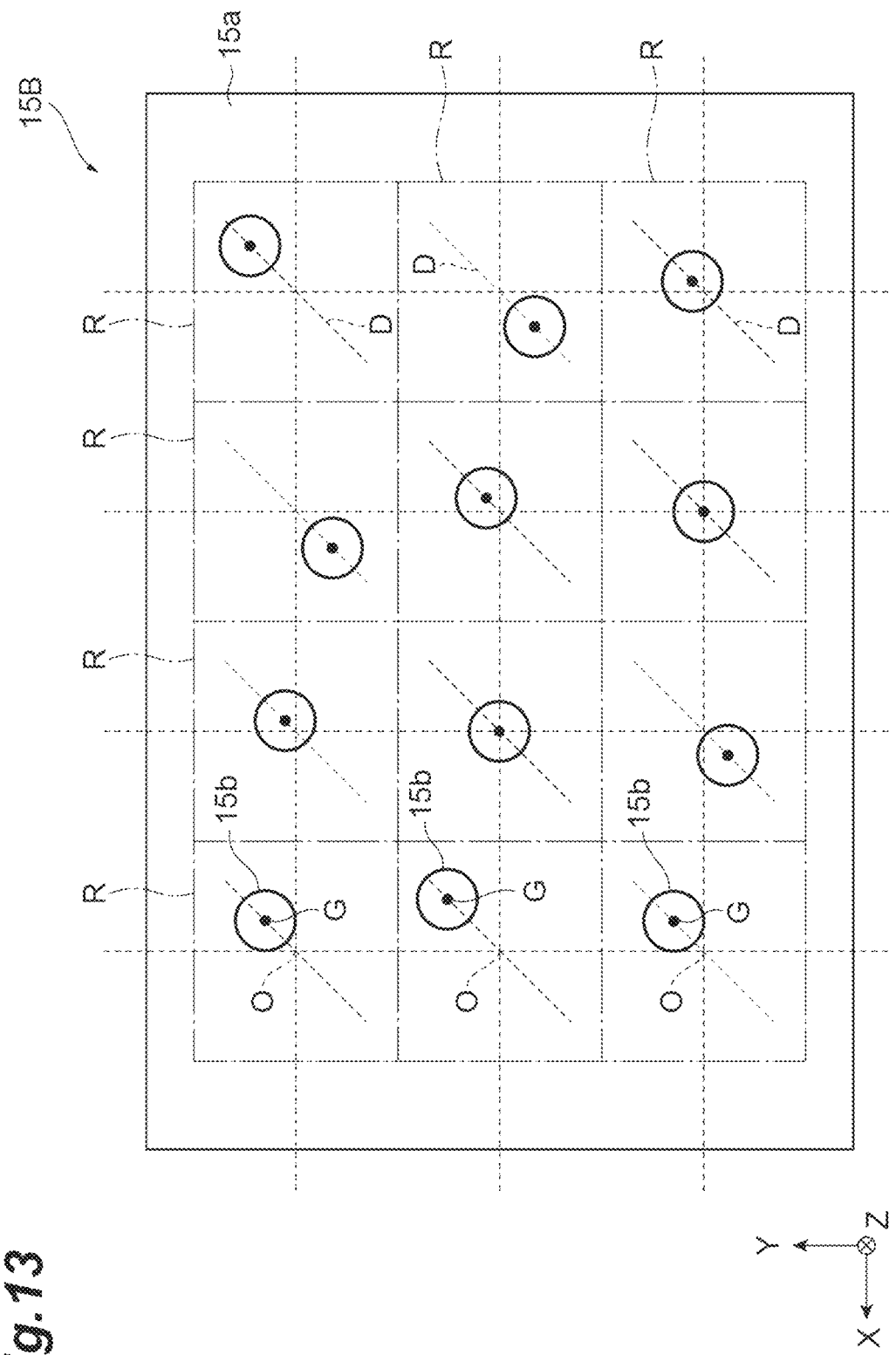
FIG. 13 is a plan view of a phase modulation layer according to a modification example.

FIG. 13 is a plan view of a phase modulation layer according to a modification example. FIG. 14 is a diagram illustrating a positional relationship between different refractive index regions in the phase modulation layer according to the modification example. As shown in FIGS. 13 and 14, the center of gravity G of each the different refractive index region 15b of the phase modulation layer 15 according to the modification example is disposed on a straight line D. The straight line D is a straight line that passes through the lattice point O corresponding to each unit configuration region R and is inclined with respect to each side of the square lattice. That is, the straight line D is a straight line which is inclined with respect to both the X axis and the Y axis. The angle of inclination of the straight line D with respect to one side (X axis) of the square lattice is θ.

The angle of inclination θ is constant within the phase modulation layer 15B. The angle of inclination θ satisfies 0°<θ<90°, and the relation of θ=45° is established in an example. Alternatively, the angle of inclination θ satisfies 180°<θ<270°, and the relation of θ=225° is established in an example. In a case where the angle of inclination θ satisfies 0°<θ<90° or 180°<θ<270°, the straight line D extends from the first quadrant of the coordinate plane defined by the X axis and the Y axis to the third quadrant thereof. The angle of inclination θ satisfies 90°<θ<180°, and the relation of θ=135° is established in an example. Alternatively, the angle of inclination θ satisfies 270°<θ<360°, and the relation of θ=315° is established in an example. In a case where the angle of inclination θ satisfies 90°<θ<180° or 270°<θ<360°, the straight line D extends from the second quadrant of the coordinate plane defined by the X axis and the Y axis to the fourth quadrant thereof. In this manner, the angle of inclination θ is an angle excluding 0°, 90°, 180° and 270°.

Here, a distance between the lattice point O and the center of gravity G is defined as r(x, y). Here, x is the position of an x-th lattice point on the X axis, and y is the position of a y-th lattice point on the Y axis. In a case where the distance r(x, y) is a positive value, the center of gravity G is located at the first quadrant (or the second quadrant). In a case where the distance r(x, y) is a negative value, the center of gravity G is located at the third quadrant (or the fourth quadrant). In a case where the distance r(x, y) is 0, the lattice point O and the center of gravity G coincide with each other. The angle of inclination is preferably 45°, 135°, 225°, or 275°. At these angles of inclination, since only two of four wavenumber vectors (for example, in-plane wavenumber vectors (±π/a, ±π/a)) forming M-point standing waves are phase-modulated, and the other two are not phase-modulated, stable standing waves can be formed.

The distance r(x, y) between the center of gravity G of each different refractive index region and the lattice point O corresponding to each unit configuration region R is individually set for each different refractive index region 15b in accordance with a phase pattern corresponding to a desired light image. The phase pattern, that is, the distribution of the distances r(x, y) has a specific value for each position which is determined by the values of x and y, but is not necessarily represented by a specific function. The distribution of the distances r(x, y) is determined from a phase distribution extracted in a complex amplitude distribution obtained by performing an inverse Fourier transform on a desired light image.

As shown in FIG. 14, in a case where the phase P(x, y) at certain coordinates (x, y) is $P_0$, the distance r(x, y) is set to 0. In a case where the phase P(x, y) is $\pi+P_0$, the distance r(x, y) is set to a maximum value $R_0$. In a case where the phase P(x, y) is $-\pi+P_0$, the distance r(x, y) is set to a minimum value $-R_0$. For the intermediate phase P(x, y), the distance r(x, y) is set so that the relation of r(x, y)={P(x, y)−$P_0$}×$R_0$/π is established. The initial phase $P_0$ can be arbitrarily set.

When the lattice spacing of the virtual square lattice is set to a, the maximum value $R_0$ of r(x, y) is set to be, for example, in the range of the following Expression (29). When the complex amplitude distribution is obtained from the desired light image, the reproducibility of a beam pattern can be improved by applying an iterative algorithm such as a Gerchberg-Saxton (GS) method which is generally used during the calculation of hologram generation.

$$0 \le R_0 \le \frac{a}{\sqrt{2}} \quad (29)$$

In the present embodiment, a desired light image can be obtained by determining the distribution of the distance r(x, y) between the different refractive index regions 15b of the phase modulation layer 15. Under the same first to fourth preconditions as in the above-described embodiment, the phase modulation layer 15 is configured to satisfy the following conditions. That is, a corresponding different refractive index region 15b is disposed within the unit configuration region R(x, y) so that the distance r(x, y) from the lattice point O(x, y) to the center of gravity G of the corresponding different refractive index region 15b satisfies the following relation.

$$r(x,y)=C\times(P(x,y)-P_0)$$

C: a proportionality constant, for example, $R_0/\pi$
$P_0$: an arbitrary constant, for example, 0

The distance r(x, y) is set to 0 in a case where the phase P(x, y) at certain coordinates (x, y) is $P_0$. The distance r(x, y) is set to the maximum value $R_0$ in a case where the phase P(x, y) is $\pi+P_0$. The distance r(x, y) is set to the minimum value $-R_0$ in a case where the phase P(x, y) is $-\pi+P_0$. In order to obtain a desired light image, it is only required that an inverse Fourier transform is performed on the light image, and that the distribution of the distance r(x, y) according to the phase P(x, y) of its complex amplitude is given to the plurality of different refractive index regions 15b. The phase P(x, y) and the distance r(x, y) may be proportional to each other.

In the present embodiment, similarly to the above-described embodiment, the lattice spacing a of the virtual square lattice and the emission wavelength λ of the active layer 12 also satisfy the conditions of M-point oscillation. In considering a reciprocal lattice space in the phase modulation layer 15, the magnitude of at least one of in-plane wavenumber vectors in four directions including wavenumber spread according to the distribution of the distances r(x, y) can be made smaller than $2\pi/\lambda$ (the light line).

In the present embodiment, the following scheme is performed on the phase modulation layer 15 in the S-iPMSEL 1 of M-point oscillation, and thus some of the 1-order light and the −1-order light are output without outputting the 0-order light into the light line. Specifically, as shown in FIG. 9, the diffraction vector V having a certain magnitude and direction is added to the in-plane wavenumber vectors K1 to K4, and thus the magnitude of at least one of the in-plane wavenumber vectors K1 to K4 is made smaller than $2\pi/\lambda$. That is, at least one of the in-plane wavenumber vectors K1 to K4 after the diffraction vector V is added is caused to fall within the circular region (light line) LL having a radius of $2\pi/\lambda$. Any of the in-plane wavenumber vectors K1 to K4 falls within the light line LL by adding the diffraction vector V satisfying Expression (19) stated above, and some of the 1-order light and the −1-order light are output.

As shown in FIG. 12, the diffraction vector V is added to vectors obtained by excluding the wavenumber spread Δk from the in-plane wavenumber vectors K1 to K4 in four directions (that is, in-plane wavenumber vectors in four directions in the square lattice PCSEL of M-point oscillation), and thus the magnitude of at least one of the in-plane wavenumber vectors K1 to K4 in four directions may be made smaller than a value $\{(2\pi/\lambda)-\Delta k\}$ obtained by subtracting the wavenumber spread Δk from $2\pi/\lambda$. That is, any of the in-plane wavenumber vectors K1 to K4 falls within the region LL2 by adding the diffraction vector V satisfying Expression (28) stated above, and some of the 1-order light and the −1-order light are output.

As an example of a specific method of adding the diffraction vector V to the in-plane wavenumber vectors K1 to K4, a method of superimposing a distance distribution r2 (x, y) (second phase distribution) irrelevant to the light image on a distance distribution r1 (x, y) (first phase distribution) which is a phase distribution according to the light image can be considered. In this case, the distance distribution r(x, y) of the phase modulation layer 15 is represented as follows.

$$r(x,y)=r1(x,y)+r2(x,y)$$

Here, r1 (x, y) is equivalent to the phase of a complex amplitude when a Fourier transform is performed on the light image as described above. In addition, r2 (x, y) is a distance distribution for adding the diffraction vector V satisfying Expression (19) or (28) stated above. A specific example of the distance distribution r2 (x, y) is the same as that in FIG. 11.

First Embodiment of Three-Dimensional Measurement Device

FIG. 15 is a schematic diagram illustrating a configuration of a three-dimensional measurement device 101A according to a first embodiment. As shown in the drawing, the three-dimensional measurement device 101A is configured to include a single light source unit 102, a plurality of (a pair of) image capture units 103, and a measurement unit 104. The light source unit 102 is constituted by the S-iPMSEL 1 of M-point oscillation described above. The measurement light 105 which is emitted from the light source unit 102 is radiated to a fixed region on the surface of the object to be measured SA placed on a stage 106. The stage 106 may be a scanning stage capable of scanning in a two-dimensional direction or a three-dimensional direction. In a case where the range of irradiation with the measurement light 105 is sufficiently wide relative to the range of measurement of the object to be measured SA, the disposition of the stage 106 may be omitted.

Figure 16:
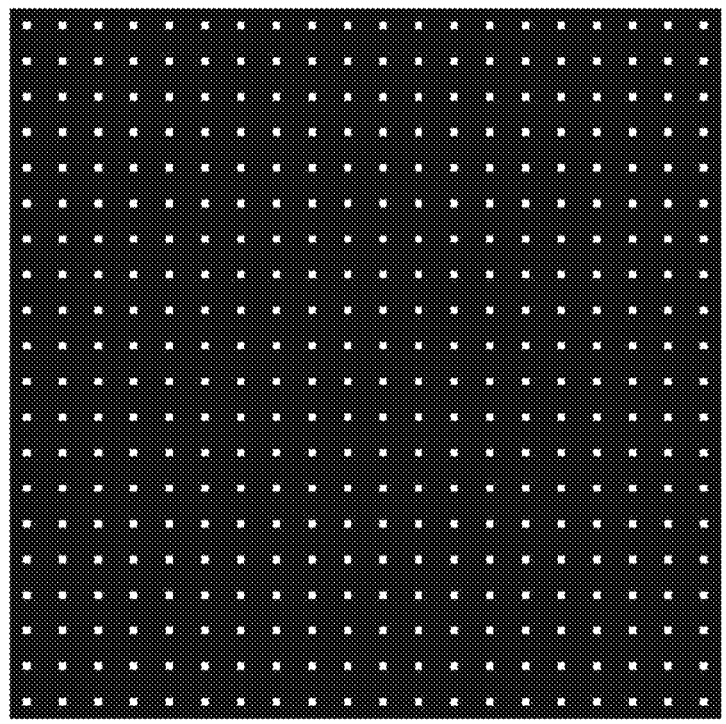
FIG. 16 is a diagram illustrating an example of a periodic pattern which is used in the first embodiment.
Figure 17A:
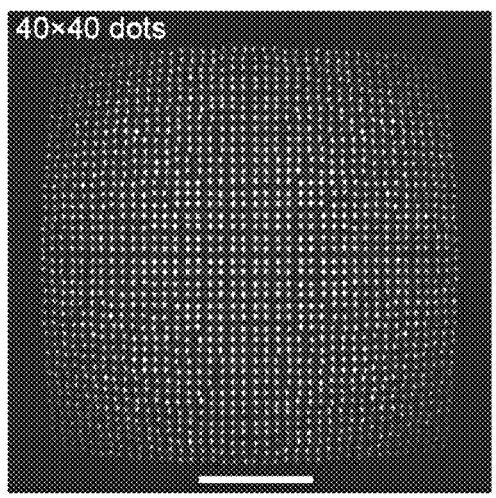
FIG. 17A is a diagram illustrating an example of a far-field image of the periodic pattern.
Figure 17B:
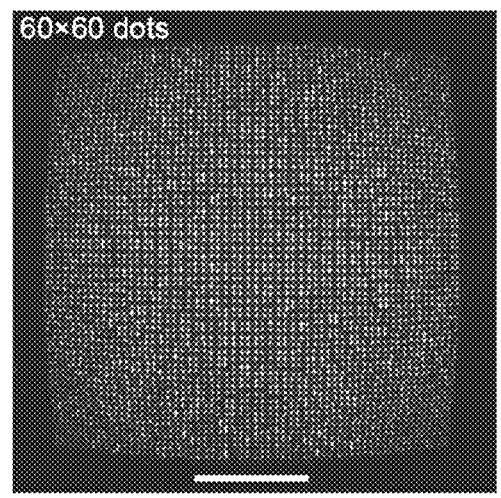
FIG. 17B is a diagram illustrating an example of a far-field image of the periodic pattern.
Figure 17C:
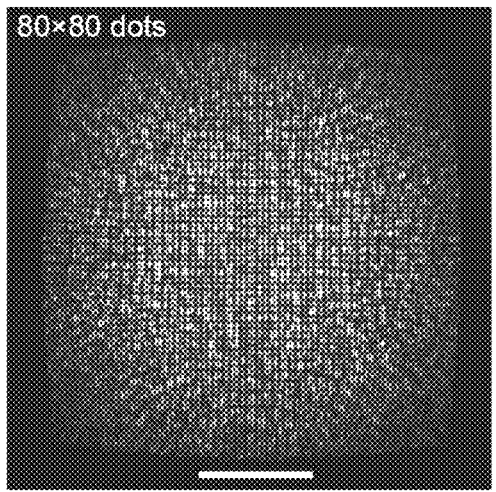
FIG. 17C is a diagram illustrating an example of a far-field image of the periodic pattern.
Figure 17D:
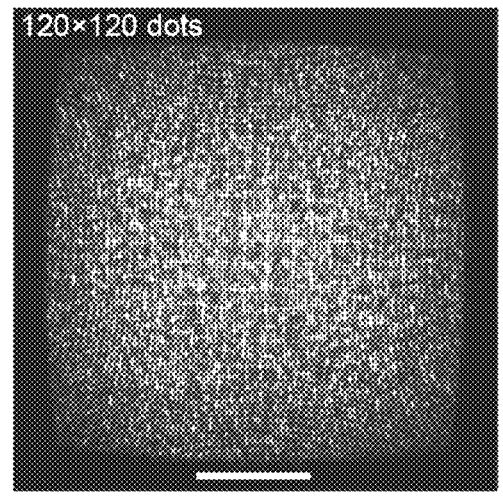
FIG. 17D is a diagram illustrating an example of a far-field image of the periodic pattern.

In the present embodiment, a predetermined pattern of the measurement light 105 is a periodic pattern W1 consisting of any of a dot pattern, a stripe pattern, and a lattice pattern. In the example of FIG. 16, the periodic pattern W1 of the measurement light 105 is a periodic dot pattern shown in an image region of 100×100 pixels. In this dot pattern, dots are arrayed in a matrix, and the dot period is a period of five pixels in both vertical and horizontal directions. FIGS. 17A to 17D are diagrams illustrating examples of far-field images of the periodic pattern. FIG. 17A is a far-field image of 40×40 dots, FIG. 17B is a far-field image of 60×60 dots, FIG. 17C is a far-field image of 80×80 dots, and FIG. 17D is a far-field image of 120×120 dots. The driving conditions of the light source unit 102 are a current of 0.5 A, a pulse width of 50 ns, a pulse interval of 5 μs, and a temperature of 25° C. The center in each drawing is the center of the measurement light 105 in the direction perpendicular to the plane, and the scale bar in each drawing corresponds to 15°. The far-field image shown in each of these drawings is designed so that dots are arrayed in a matrix on a plane screen, and the distortion of array of portions away from the center is caused by the optical system of a measurement system.

The image capture unit 103 is constituted by a device sensitive to the measurement light 105 which is emitted from the light source unit 102. Examples of the image capture unit 103 capable of being used include a charge coupled device (CCD) camera, a complementary MOS (CMOS) camera, other two-dimensional image sensors, and the like. The image capture unit 103 captures an image of the object to be measured SA in a state of being irradiated with the measurement light 105, and outputs an output signal indicating results of image capture to the measurement unit 104.

The measurement unit 104 is constituted by, for example, a computer system configured to include a processor, a memory, and the like. The measurement unit 104 executes various control functions using the processor. Examples of the computer system include a personal computer, a microcomputer, a cloud server, a smart device (such as a smartphone or a tablet terminal), and the like. The measurement unit 104 may be constituted by a programmable logic controller (PLC), or may be constituted by an integrated circuit such as a field-programmable gate array (FPGA).

The measurement unit 104 is communicably connected to the image capture unit 103, and performs the three-dimensional shape measurement of the object to be measured SA on the basis of an output signal which is input from the image capture unit 103. In the present embodiment, the measurement unit 104 measures the three-dimensional shape of the object to be measured SA on the basis of an active stereo method using the periodic pattern W1. Here, as an example, a three-dimensional shape measurement method based on the principle of parallel coordinate stereo is shown. In a case where a disparity arising from a pair of image capture units 103 and 103 is set to D, a distance between the pair of image capture units 103 and 103 is set to b, a focal length of the pair of image capture units 103 and 103 is set to f, and a distance from the pair of image capture units 103 and 103 to the object to be measured SA is set to Z, the disparity D is given by D=(f/Z)b. Since the distance b between the image capture units 103 and 103 and the focal length of image capture units 103 and 103 are both unique values, the distance Z to the object to be measured SA can be obtained by obtaining the disparity D.

In the present embodiment, the object to be measured SA is irradiated with the measurement light 105 having the periodic pattern W1. In this case, the same point of the periodic pattern W1 of which an image is captured by each of the image capture units 103 and 103 can be discriminated by the measurement unit 104. In addition, it is possible to perform three-dimensional measurement using an image having little texture and three-dimensional measurement in a dark portion which are a problem in a passive stereo method. By using the periodic pattern W1 represented by periodic dots, it is possible to suppress a bias in the pattern density of the measurement light 105, and to suppress non-uniformity of the accuracy of measurement caused by the position of illumination with the measurement light 105.

Figure 18:
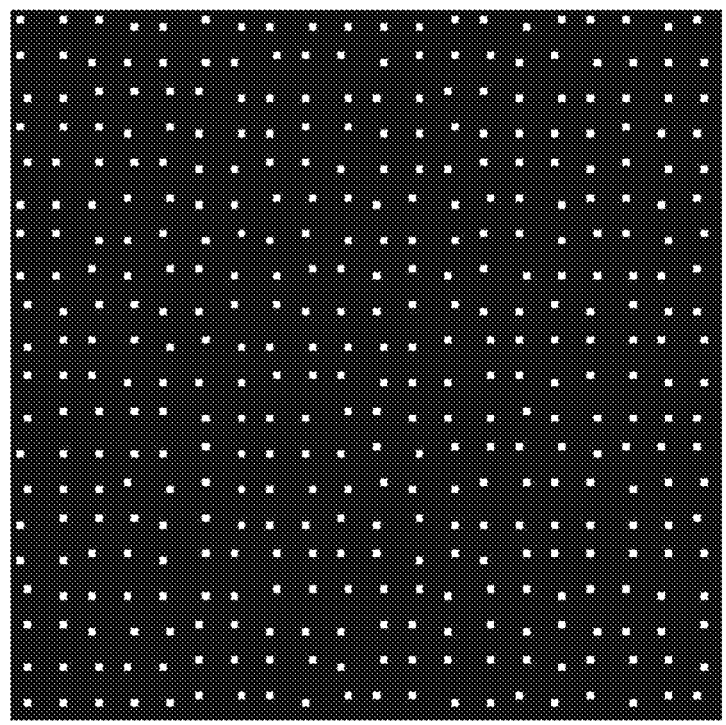
FIG. 18 is a diagram illustrating an example of a random dot pattern which is used in the first embodiment.

In the present embodiment, for example, a random dot pattern W2 as shown in FIG. 18 may be used instead of the periodic pattern W1. The random dot pattern W2 is a pattern obtained by randomly shifting each dot of the dot pattern shown in FIG. 16 two-dimensionally in the range of a fundamental period region (a rectangular region surrounded by segments perpendicular to the midpoint between adjacent lattice points) from the position of the lattice point. As an example, a random number φ(ix, iy) may be allocated to each dot located at the lattice point, and each dot may be shifted from the position of the lattice point on the basis of the random number q.

In this case, since the random dot pattern W2 has a pseudo periodicity, it is possible to suppress a bias in the pattern density of the measurement light 105, and to suppress non-uniformity of the accuracy of measurement caused by the position of illumination with the measurement light 105. In addition, by using the random dot pattern W2 instead of a periodic dot pattern, it is possible to suppress misrecognition when the same point of the dot pattern is imaged by a different image capture unit 103. Therefore, it is possible to improve the accuracy of measurement of the disparity D, and to improve the accuracy of three-dimensional shape measurement.

Figure 19:
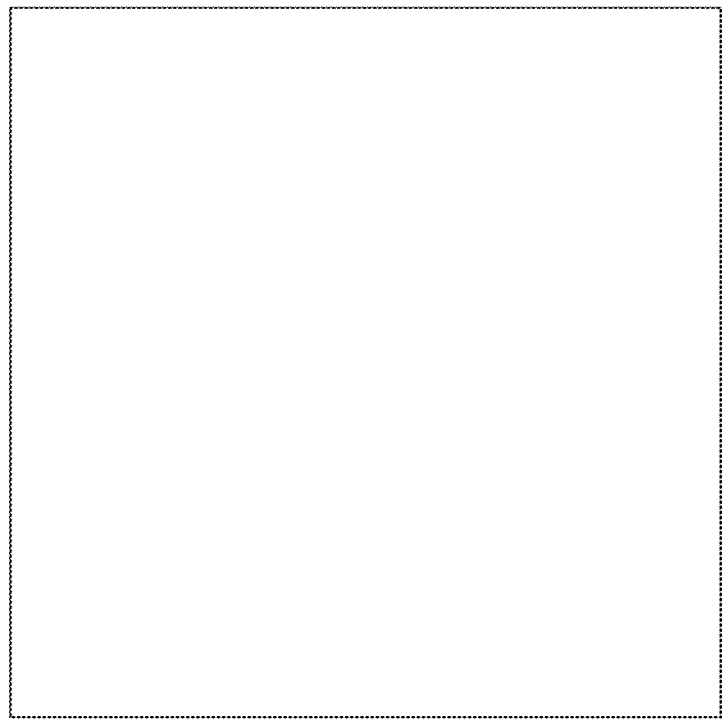
FIG. 19 is a diagram illustrating an example of a pattern having a uniform density which is used in the first embodiment.

In the present embodiment, a pattern W3 having a uniform density as shown in FIG. 19 may be used instead of the periodic pattern W1. Since light emitted from the S-iPMSEL 1 is a laser beam, speckles can occur in scattered light. In addition, in phase calculation, unintentional mixing of speckle-like noise may occur. Therefore, even in a case where the pattern W3 having a uniform density is used, the random dot pattern is formed in the pattern of the measurement light 105. By using this random dot pattern, it is possible to suppress misrecognition when the same point of the dot pattern is imaged by a different image capture unit 103.

Figure 20:
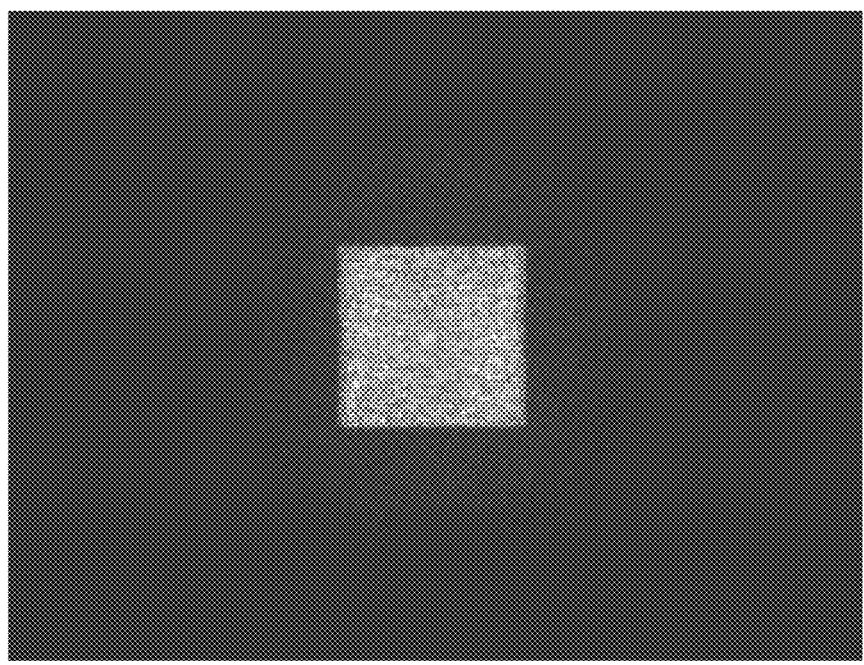
FIG. 20 is a diagram illustrating an example of an FFP of a pattern having a uniform density.

FIG. 20 is a diagram illustrating an example of a far field pattern (FFP) of the pattern W3 having a uniform density. In the example of the drawing, the FFP is observed at room temperature with the pulse width of the measurement light 105 set to 50 ns and a repetition interval set to 5 μs. In addition, color tone correction with a brightness of +40% and a contrast of −40% is added. In the drawing, even in a case where the pattern W3 having a uniform density is used, it can be confirmed that the random dot pattern is formed in the pattern of the measurement light 105.

In the example of FIG. 15, the three-dimensional measurement device 101A includes the single light source unit 102, but the three-dimensional measurement device 101A may include a plurality of light source units 102. In this case, a different region of the object to be measured SA is irradiated with the measurement light 105 from each of the light source units 102, and thus a measurement region can be enlarged without scanning the stage 106. In a case where such a configuration is adopted, the disposition of the stage 106 may be omitted.

Second Embodiment of Three-Dimensional Measurement Device

Figure 21:
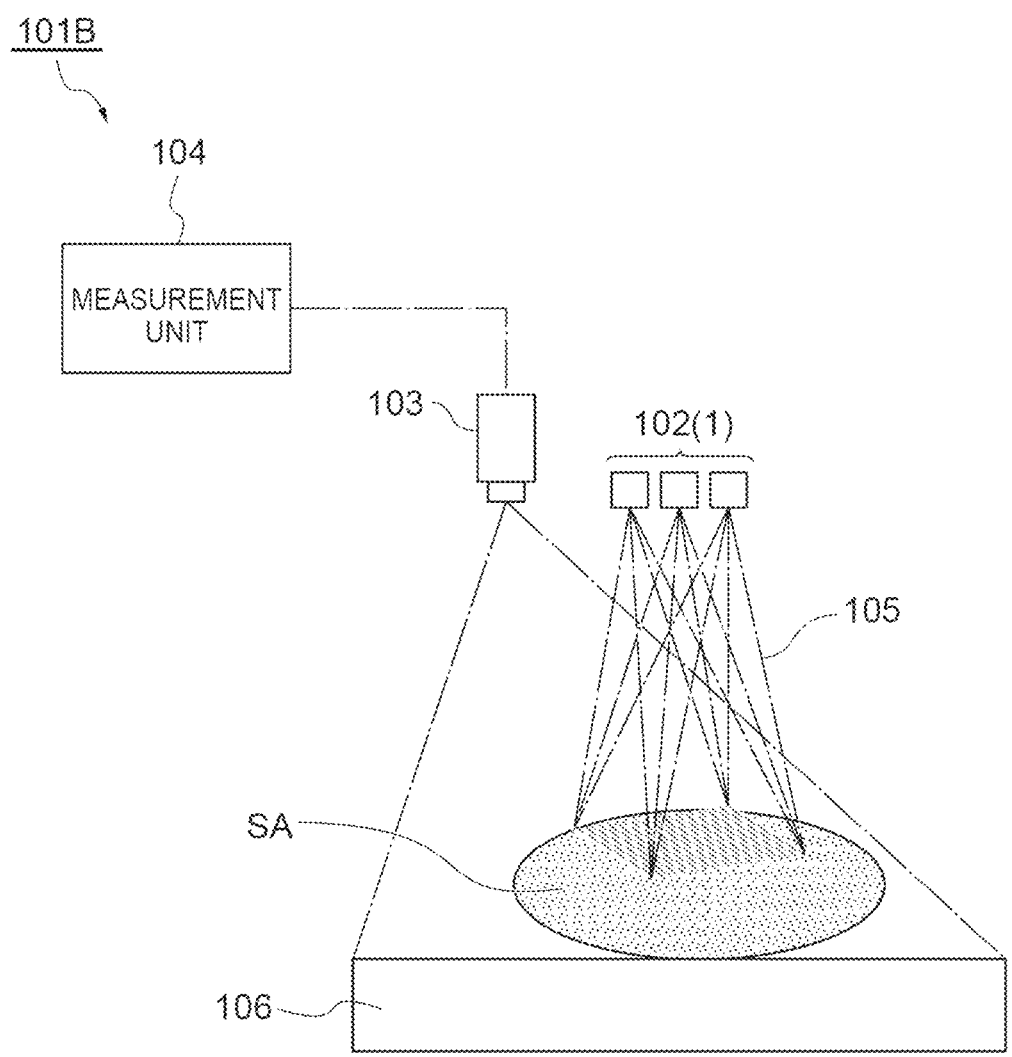
FIG. 21 is a schematic diagram illustrating a configuration of a three-dimensional measurement device according to a second embodiment.

FIG. 21 is a schematic diagram illustrating a configuration of a three-dimensional measurement device according to a second embodiment. As shown in the drawing, a three-dimensional measurement device 101B according to the second embodiment is configured to include a plurality of light source units 102, a single image capture unit 103, and a measurement unit 104. The configurations of the image capture unit 103, the light source unit 102, and the measurement unit 104 are the same as those in the first embodiment. In the present embodiment, the predetermined pattern of the measurement light 105 is a gray code pattern, and the measurement unit 104 measures the three-dimensional shape of the object to be measured SA on the basis of a triangulation method using the gray code pattern.

FIG. 22 is a diagram illustrating an example of a gray code pattern. In the example of the drawing, the number of pixels of the image capture unit 103 is Nx×Ny shown in the X direction. In a case where a pixel position n in the X direction (n is an integer of 0 to Nx−1) is set to an Mx-digit binary number, a gray code pattern W4 is represented by an exclusive logical sum of a binary representation of the number of objects and a number obtained by shifting the binary representation of the number of objects to the right of 1 bit and adding 0 to its head. That is, in a case where the number of objects is set to n, the gray code pattern W4 is given by a logical expression with n^(n>>1). In the example of FIG. 22, gray code patterns W4a to W4d in the case of 4 bits (four patterns) are shown. For example, OpenCV or the like can be used for the generation of the gray code pattern W4.

In the gray code, a Hamming distance between adjacent pixels is set to 1. The term "Hamming distance" refers to the number of digits having different values located at corresponding positions when two values having the same number of digits are compared with each other. Therefore, in the gray code having a Hamming distance of 1, an error falls within 1 even in a case where a bit error occurs when a bit string is restored. In a simple binary code, an error in a position in a case where an error occurs in a high-order bit becomes larger, but in the gray code, a code resistant to noise is obtained.

In a case where the gray code is used, it is only required that the number of light source units 102 arranged is the number of patterns corresponding to each digit of the binary number. That is, the gray code patterns W4a to W4d are constituted by a plurality of stripe-like patterns in which 0 and 1 of each pixel of each digit from the most significant bit to the least significant bit are set to be different from each other. In a case where the image capture unit 103 performs image capture while sequentially switching each pattern from the gray code pattern W4a of the most significant bit to the gray code pattern W4d of the least significant bit in the light source unit 102, a value X is obtained by image capture Mx times. It can be understood that the position of an X-th pixel is measured on the basis of this value X. Similarly, in the Y direction, a value Y is obtained by image capture My times by the image capture unit 103 performing image capture while sequentially switching the gray code patterns W4a to W4d. It can be understood that the position of a Y-th pixel is measured on the basis of this value Y.

In order to avoid misrecognition due to the color of the surface of the object to be measured SA, the gray code patterns W4a to W4d shown in FIG. 22 may be used in combination with gray code patterns in which black and white are reversed. In this case, the number of the light source units 102 arranged is preferably set to 2Mx+2My.

Figure 23:
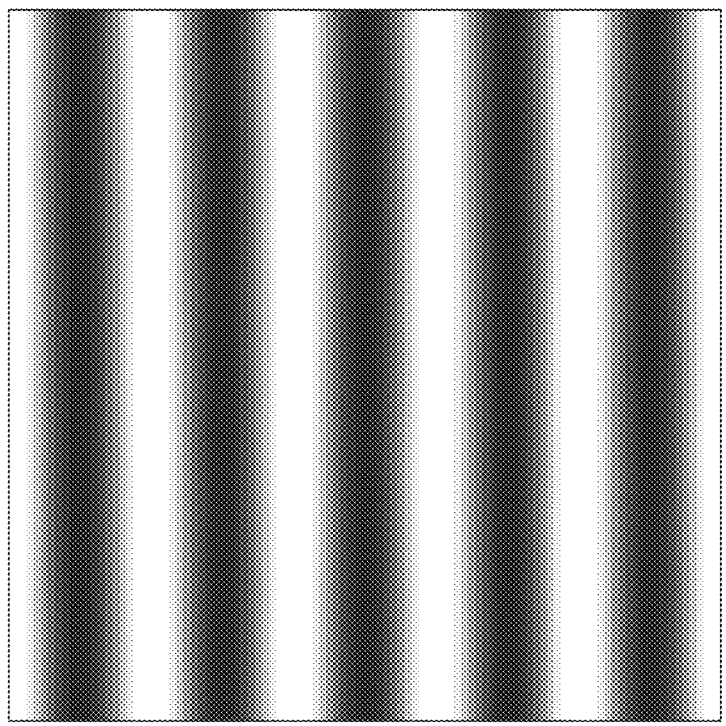
FIG. 23 is a diagram illustrating an example of a sinusoidal stripe pattern which is used in the second embodiment.

In the present embodiment, for example, as shown in FIG. 23, a sinusoidal stripe pattern W5 may be used instead of the gray code pattern W4. The sinusoidal stripe pattern W5 shown in FIG. 23 is a periodic stripe pattern shown in an image region of 100×100 pixels. The period of the sinusoidal stripe pattern W5 is a period of 20 pixels. The measurement unit 104 measures the three-dimensional shape of the object to be measured SA on the basis of a phase shift method using the sinusoidal stripe pattern W5. In such a form, for example, a plurality of the sinusoidal stripe patterns W5 to which a phase shift (positional shift) obtained by equally dividing one period with respect to a lattice pitch is given are used. As for the pattern of a phase shift, it is only required that a pattern of which the phase is shifted by $2\pi/N$ (N is an integer) is prepared.

Here, a case where four sinusoidal stripe patterns W5 having different phase shifts are used will be illustrated. In a case where the light intensities of the measurement light 105 having four sinusoidal stripe patterns W5 are set to I0 to I3, respectively, and the pixels of the image capture unit 103 are set to (x, y), the light intensities I0 to I3 on the surface of the object to be measured SA are represented by the following Expressions (30) to (33). Ia(x, y) is the amplitude of a lattice pattern, Ib(x, y) is a background intensity, and θ(x, y) is an initial phase.

$$I0=Ia(x,y)\cos\{\theta(x,y)\}+Ib(x,y) \quad (30)$$

$$I1=Ia(x,y)\cos\{\theta(x,y)+\pi/2\}+Ib(x,y) \quad (31)$$

$$I2=Ia(x,y)\cos\{\theta(x,y)+\pi\}+Ib(x,y) \quad (32)$$

$$I3=Ia(x,y)\cos\{\theta(x,y)+3\pi/2\}+Ib(x,y) \quad (33)$$

The initial phase θ can be obtained by $\tan\theta=-(I3-I1)/(I2-I0)$. In a case where the phase shift number of the sinusoidal stripe pattern W5 is N, the initial phase θ can be obtained by the following Expression (34).

$$\tan\theta = -\sum_{n=0}^{N-1} \frac{In \sin\left(n\frac{2\pi}{N}\right)}{In \cos\left(n\frac{2\pi}{N}\right)} \quad (34)$$

In a case where such a phase shift method is used, the measured phase is converted into height, so that it is possible to measure the height of the object to be measured SA at an interval smaller than the pitch of the sinusoidal stripe pattern W5. In the configuration of the three-dimensional measurement device 101B, the light source units 102 may be arrayed in a direction parallel to the stripe in the sinusoidal stripe pattern W5. In this case, it is possible to eliminate a phase shift caused by the positional shift of the light source unit 102, and to eliminate a shift of the initial phase in each of the plurality of the sinusoidal stripe patterns W5.

Figure 24:
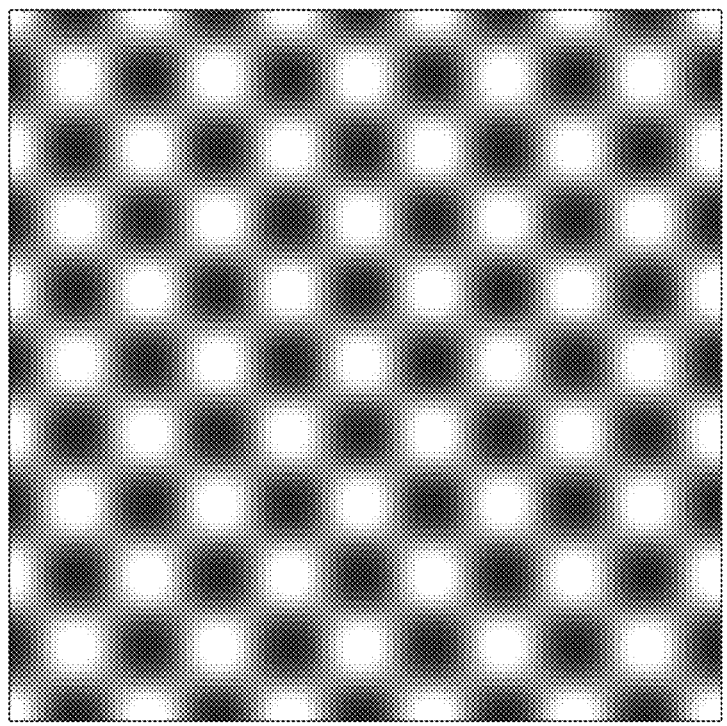
FIG. 24 is a diagram illustrating an example of a sinusoidal matrix pattern which is used in the second embodiment.

In the present embodiment, the light source units 102 may be arrayed in biaxial directions orthogonal to each other. In this case, by switching on/off of the measurement light 105 for each axis, the height profile of the object to be measured SA can be acquired on two axes. For example, as shown in FIG. 24, a matrix pattern W6 that changes in a sinusoidal manner in biaxial directions orthogonal to each other may be used instead of the sinusoidal stripe pattern W5. In a case where such a matrix pattern W6 is used, the height profile of the object to be measured SA can be simultaneously measured in biaxial directions.

Figure 25:
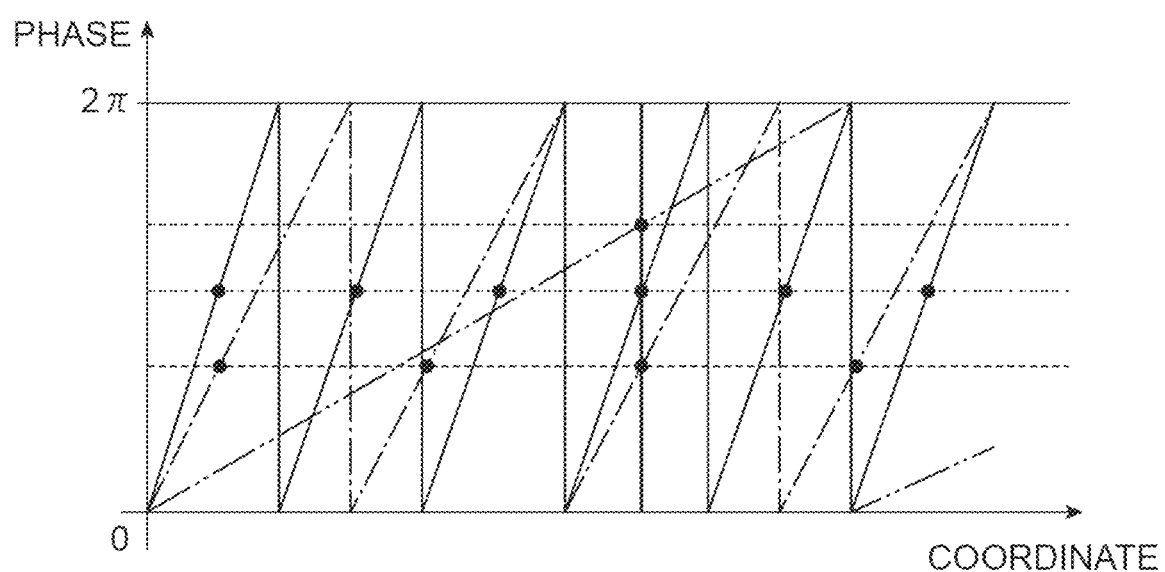
FIG. 25 is a diagram illustrating a state of improved discontinuity in a phase 2.

In the present embodiment, the plurality of light source units 102 may output the sinusoidal stripe patterns W5 having different periods from each other. In the above-described phase shift method, the discontinuity in a phase of 2π has arisen as a problem. On the other hand, in a case where the sinusoidal stripe patterns W5 having different periods from each other are used, for example, as shown in FIG. 25, by selecting matching coordinates at all frequencies, it is possible to improve the discontinuity in a phase of 2π, and to realize high-accuracy three-dimensional measurement using a small number of patterns. By improving the discontinuity in a phase of 2π, it is possible to realize the expansion of the measurement range of three-dimensional shape measurement and the high-accuracy measurement of the object to be measured SA with remarkable unevenness.

Figure 26A:
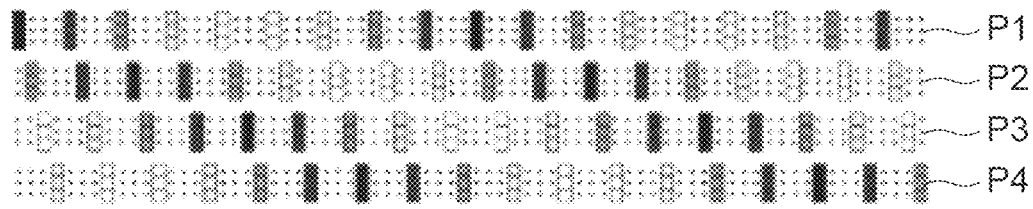
FIG. 26A is a diagram illustrating an example of a moire stripe pattern which is used in the second embodiment.
Figure 26B:
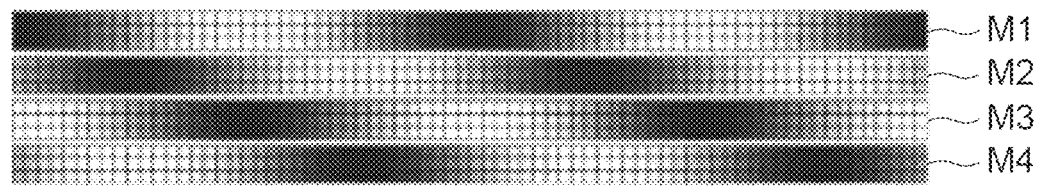
FIG. 26B is a diagram illustrating an example of a moire stripe pattern which is used in the second embodiment.

In the present embodiment, the measurement unit 104 may measure the three-dimensional shape of the object to be measured SA on the basis of a sampling moire method using the sinusoidal stripe pattern W5. The sampling moire method uses the deformation of the lattice of the sinusoidal stripe pattern W5 projected onto the surface of the object to be measured SA in accordance with the height of the object to be measured SA. Here, in an image captured by the image capture unit 103, the stripe interval of one sinusoidal pattern of the phase shift number N at the height of the reference surface is adjusted in advance so as to correspond to N pixels of a camera. Here, the phase shift number N is set to 4. Irradiation with one sinusoidal pattern is performed, and the pixels of the image capture unit 103 are sampled for every N=4 pixels, so that four patterns P1 to P4 imaged for every four pixels (with three pixels between imaging pixels thinned out) are obtained as shown in FIG. 26A. The imaging pixels are shifted one by one between these patterns P1 to P4, and the luminance value of the imaging pixels is linearly complemented, so that moire stripe patterns M1 to M4 of which the phases are shifted from each other are obtained as shown in FIG. 26B. By applying the above-described phase shift method using these moire stripe patterns M1 to M4, it is possible to measure the height of the object to be measured SA at an interval smaller than the pitch of the sinusoidal stripe pattern W5. According to such a method, it is possible to make the number of sinusoidal patterns to be radiated smaller and to make the light source unit 102 compacter than in the above-described phase shift method.

Figure 27:
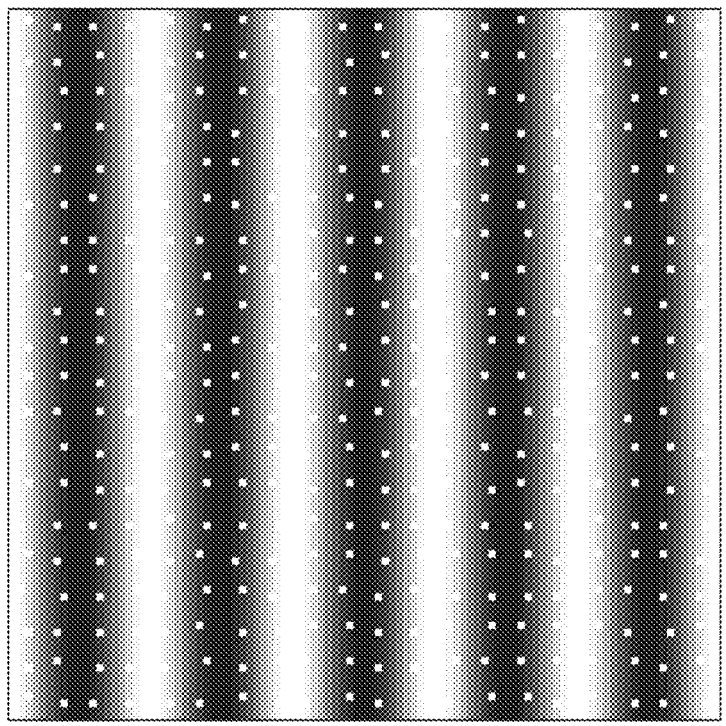
FIG. 27 is a diagram illustrating an example of a superimposition pattern which is used in the second embodiment.
Figure 28:
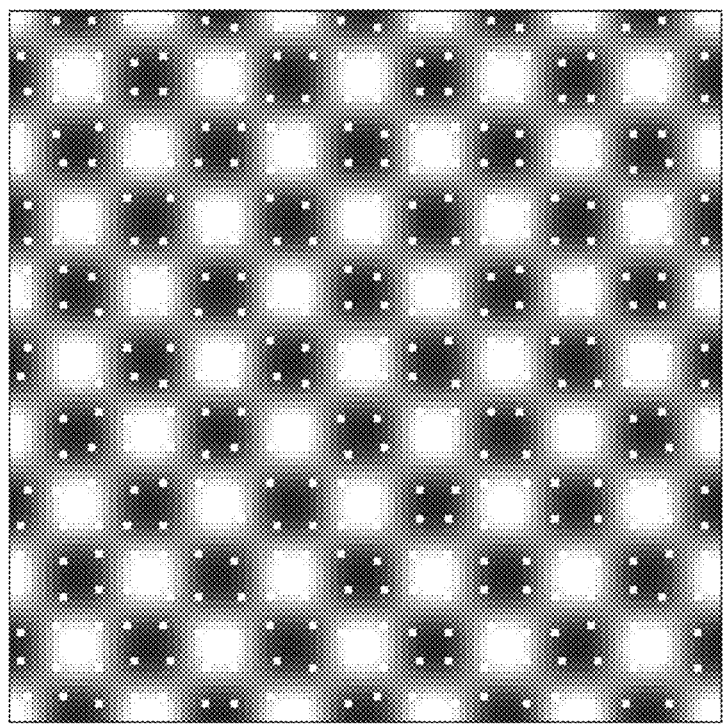
FIG. 28 is a diagram illustrating another example of a superimposition pattern which is used in the second embodiment.

In the present embodiment, for example, as shown in FIG. 27, a superimposition pattern W7 obtained by superimposing the sinusoidal stripe pattern W5 on the random dot pattern W2 may be used instead of the sinusoidal stripe pattern W5. By using such a superimposition pattern W7, it is possible to measure the height of the object to be measured SA at an interval smaller than the pitch of the sinusoidal stripe pattern W5. In addition, by also using the random dot pattern, it is possible to improve the discontinuity in a phase of $2\pi$, and to realize high-accuracy three-dimensional measurement using a small number of patterns. As shown in FIG. 28, the superimposition pattern may be a superimposition pattern W8 obtained by superimposing the matrix pattern W6 that changes in a sinusoidal manner on the random dot pattern W2. In this case, the height profile of the object to be measured SA can be simultaneously measured in biaxial directions in addition to the above-described effect.

In the present embodiment, both the sinusoidal stripe pattern W5 and the gray code pattern W4 may be used. In this case, the measurement unit 104 measures the three-dimensional shape of the object to be measured SA on the basis of a phase shift method using the sinusoidal stripe pattern W5 and a triangulation method using the gray code pattern W4. In this case, a pixel level can be measured by the triangulation method using the gray code pattern W4, and a sub-pixel level can be measured by the phase shift method using the sinusoidal stripe pattern W5. In addition, by using the gray code, it is possible to improve the discontinuity in a phase of $2\pi$, and to realize high-accuracy three-dimensional measurement using a small number of patterns.

[Third Embodiment of Three-Dimensional Measurement Device]

Figure 29:
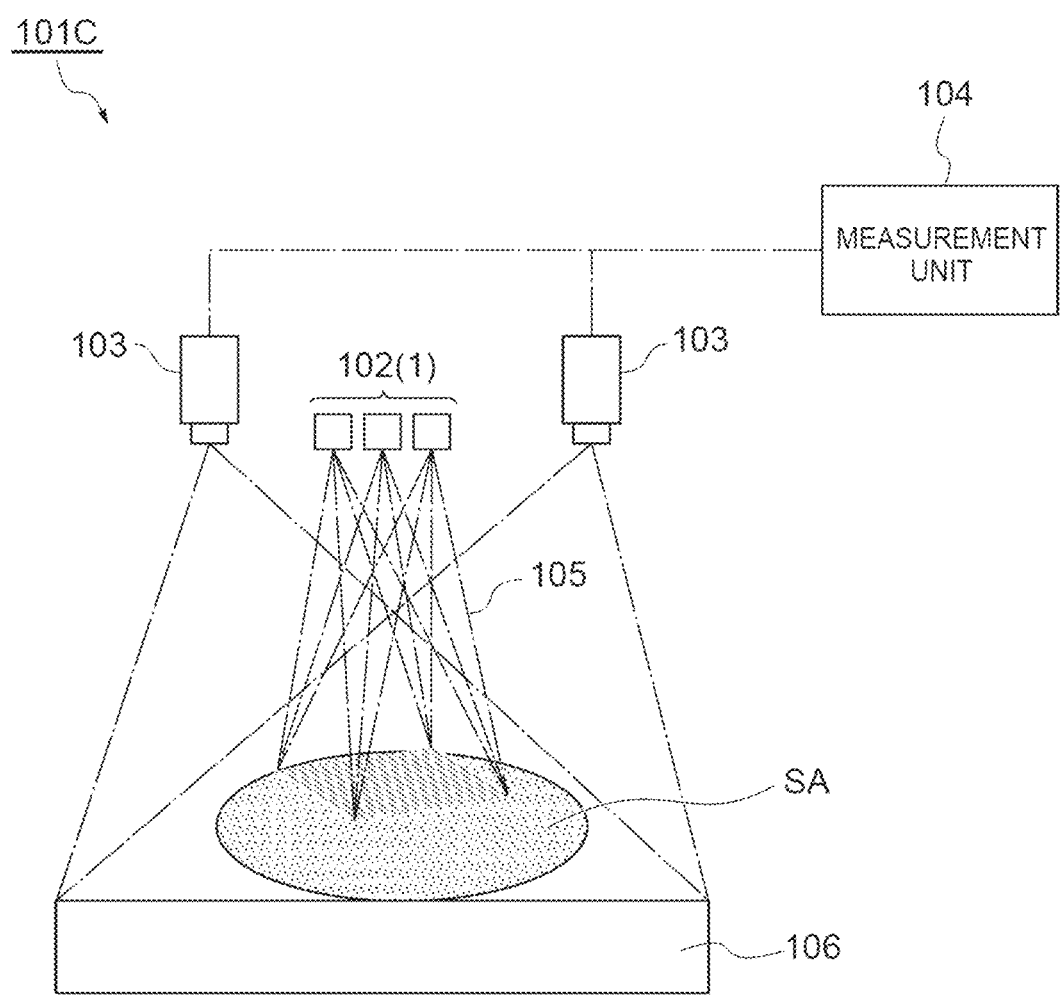
FIG. 29 is a schematic diagram illustrating a configuration of a three-dimensional measurement device according to a third embodiment.

FIG. 29 is a schematic diagram illustrating a configuration of a three-dimensional measurement device according to a third embodiment. As shown in the drawing, a three-dimensional measurement device 101C according to the third embodiment is configured to include a plurality of light source units 102, a plurality of (a pair of) image capture units 103, and a measurement unit 104. The configurations of the image capture unit 103, the light source unit 102, and the measurement unit 104 are the same as those in the first embodiment. In the present embodiment, the predetermined pattern of the measurement light 105 is the sinusoidal stripe pattern W5, and the measurement unit 104 measures the three-dimensional shape of the object to be measured SA on the basis of the phase shift method and active stereo method using the sinusoidal stripe pattern W5.

In the present embodiment, the measured phase is converted into height, so that it is possible to measure the height of the object to be measured SA at an interval smaller than the pitch of the sinusoidal stripe pattern W5. In addition, by also using an active stereo method using the plurality of image capture units 103, it is possible to improve the discontinuity in a phase of $2\pi$, and to realize high-accuracy three-dimensional measurement using a small number of patterns. In a case where the active stereo method is used, the method may be used while switching the above-described dot patterns.

[Phase Shift of Sinusoidal Stripe Pattern by S-iPMSEL]

In the S-iPMSEL 1, the −1-order light symmetric with respect to the normal line of a light emission surface is output in addition to the designed 1-order light (see FIG. 6). Therefore, in a case where the phase shift of the sinusoidal stripe pattern W5 is performed, considering sinusoidal waves in which beams of the +1-order light overlap each other, a direction in which the stripe is shifted between the 1-order light and the −1-order light is reversed, and thus there is a concern of the pattern deviating from a design. For the purpose of simplifying the description, considering a shift of the stripe in the X-axis direction, the complex amplitude of the 1-order light is represented by the following Expression (35). The complex amplitude of the −1-order light is emitted to a position symmetric to the 1-order light with respect to the surface normal line, and is represented by the following Expression (36). In the expression, k (=kx, ky, kz) is a wavenumber vector (magnitude $2\pi/\lambda$), $\lambda$ is a wavelength, w is each frequency of light, $\Delta\theta$ is a phase shift, a1 is a 1-order light amplitude (a component caused by a phase distribution of actual hole arrangement with respect to an ideal phase distribution), K is the wavenumber of the stripe of a sine wave (=$2\pi/\Lambda$ ($\Lambda$ is the period of a sine wave)), $\theta$ is the phase shift amount of a sine wave, and (x, y, z) is the coordinates of a projection beam.

$$A_1 = a\cos(Kx+\theta)\exp\{j(\omega t - k_x x - k_y y - k_z z)\} \quad (35)$$

$$A_{-1} = a_{-1}\cos(Kx+\theta)\exp\{j(\omega t + k_x x + k_y y - k_z z)\} \quad (36)$$

In this case, a composite amplitude A can be obtained by the following Expression (37) on the basis of the amplitudes of the 1-order light and the −1-order light.

$$A = \cos(Kx+\theta) a_1 \exp[j\{\omega t - k_z z - (k_x x + k_y y)\}] + a_{-1} \exp[j\{\omega t - k_z z = +(k_x x + k_y y)\}] \quad (37)$$

Since the actual light intensity is proportional to the square of the composite amplitude A, it can be obtained by the following Expression (38).

$$I = A\overline{A} = \cos^2(Kx+\theta)\{a_1^2 + a_{-1}^2 + 2a_1 a_{-1}\cos(k_x x + k_y y)\} \quad (38)$$

The period of a fundamental light wave is sufficiently smaller than the period of the sine wave ($\lambda << \Lambda$). Therefore, the wavenumber k of the fundamental light wave is sufficiently larger than the wavenumber K of the stripe of the sine wave (k>>K). Therefore, in Expression (38), it can be considered that terms corresponding to a change in k may be averaged. In this case, the intensity I of light obtained by superimposing the ±1-order light can be approximated by the following Expression (39).

$$I \cong (a_1^2 + a_{-1}^2)\frac{\cos\{2(Kx+\theta)\}+1}{2} \quad (39)$$

From these expressions, in a case where the phase shift of the sinusoidal stripe pattern W5 is performed, it can be understood that the stripe can be shifted with the sine wave shape maintained even when beams of the +1-order light overlap each other. In addition, in a sinusoidal pattern in which beams of the +1-order light overlap each other, it can be understood that an interval between the stripes having light intensity (square of the sum of the amplitudes of the +1-order light) actually obtained with respect to a design pattern (1-order light amplitude) is halved, and that the phase shift amount is doubled for one period. Therefore, in a case where a phase shift of $\pi/2$ is realized, for example, in light intensity obtained finally, the design value of the phase shift amount of the 1-order light amplitude is preferably set to $\pi/4$. The same is true of the sinusoidal matrix pattern W6 having a period in biaxial directions.

As shown in FIG. 4, in a case where the center of gravity G of the different refractive index region 15b in the S-iPMSEL 1 is formed by shifting the center in a circumferential direction around the lattice point O, the amplitudes a of the 1-order light and the −1-order light have values equal to each other. On the other hand, as shown in FIG. 14, in a case where the center of gravity G of the different refractive index region 15b in the S-iPMSEL 1 is formed by shifting the center onto the straight line D that passes through the lattice point O and is inclined with respect to each side of the square lattice, the amplitudes a of the 1-order light and the −1-order light have values different from each other. In either case, it is possible to use a sinusoidal pattern in which beams of the ±1-order light overlap each other.

In a case where the 1-order light and the −1-order light are asymmetric patterns, there is a problem in that a designed pattern is not obtained when the 1-order light and the −1-order light overlap each other. An example of such a problem is that the structure of the 1-order light per bright spot has asymmetric spread and a design pattern becomes unclear. In this case, it is only required that the emission region of the 1-order light is limited to a region in which a solid angle is $\pi$. For example, in a case where the emission region of the 1-order light is limited to the first quadrant and the second quadrant, the emission region of the −1-order light becomes the fourth quadrant and the third quadrant, and thus it is possible to avoid the 1-order light and the −1-order light overlapping each other. This makes it possible to suppress the spread of the bright spot due to overlap of the 1-order light and −1-order light. In a case where the lattice pattern is shifted by the phase shift method, the shift direction of the −1-order light is reversed to the shift direction of the 1-order light. Therefore, it is preferable to reverse a phase obtained by a phase shift calculation in accordance with each emission region of the 1-order light and the −1-order light. On the other hand, in a case where an image having little noise is obtained without superimposing the 1-order light and the −1-order light even when the above problem not occur, each of the projection regions of the ±1-order light may be used without superimposition thereof.

[Arrangement Example of Light Source Units and Image Capture Units]

Figure 30:
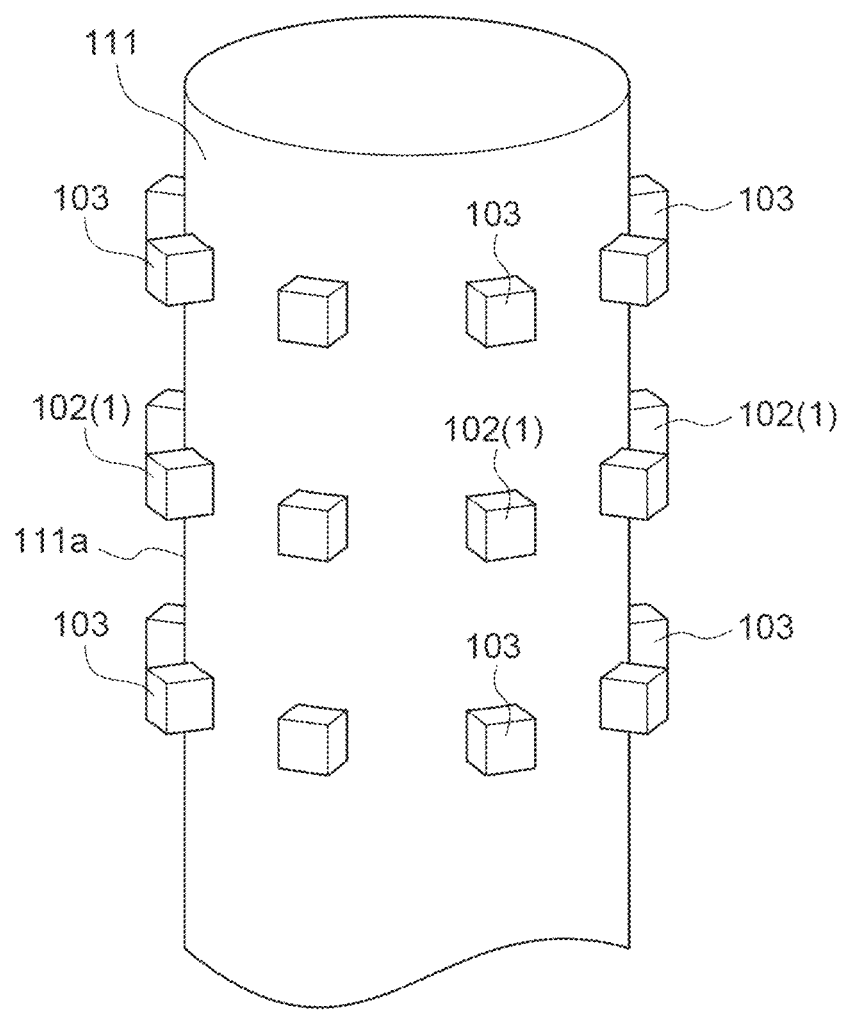
FIG. 30 is a schematic perspective view illustrating an arrangement example of light source units and image capture units.

FIG. 30 is a schematic perspective view illustrating an arrangement example of light source units and image capture units. As shown in FIG. 30, in constituting the three-dimensional measurement device 101, the light source units 102 and the image capture units 103 may be arranged on the surface of a three-dimensional object 111. The three-dimensional object 111 constitutes a portion equivalent to probes of the three-dimensional measurement devices 101A to 101C. The three-dimensional object 111 is formed of, for example, a metal or a resin in a cylindrical shape. The three-dimensional object 111 may have rigidity, or may have flexibility. The three-dimensional object 111 may have an internal space.

The light source units 102 and the image capture units 103 are arranged at regular intervals (here, a phase angle of) 45° in a circumferential direction on a circumferential surface 111a of the cylindrical three-dimensional object 111. In the example of FIG. 30, a group of the image capture units 103 on one side, a group of the light source units 102, and a group of the image capture units 103 on the other side are arranged at regular intervals from the tip side of the three-dimensional object 111 to the base end side thereof. When the three-dimensional object 111 is viewed in a longitudinal direction, one image capture unit 103, the light source unit 102, and the other image capture unit 103 are lined up in a row, and the set thereof constitutes one measurement region for the object to be measured SA. In a case where the three-dimensional object 111 has an internal space, wiring or the like for the light source unit 102 and the image capture unit 103 may be received in the internal space. The arrangement intervals of the light source unit 102 and the image capture unit 103 may not necessarily be equally spaced intervals. In a case where the range of measurement for the object to be measured SA is covered, the single light source unit 102 and the single image capture unit 103 may be disposed on the three-dimensional object 111.

Figure 31:
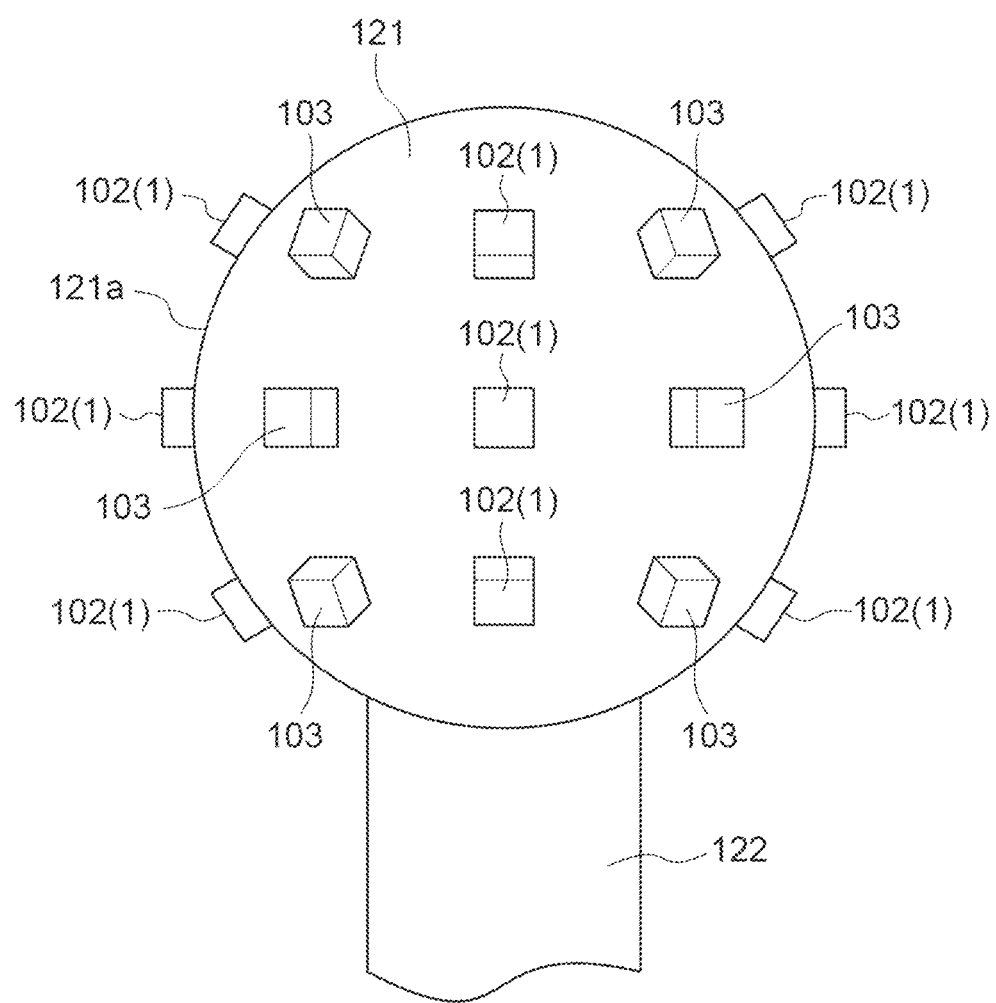
FIG. 31 is a schematic perspective view illustrating another arrangement example of the light source units and the image capture units.

FIG. 31 is a schematic perspective view illustrating another arrangement example of the light source units and the image capture units. In the example of FIG. 31, a three-dimensional object 121 is formed in a spherical shape, and is provided at, for example, the tip portion of a cylindrical support 122. The light source units 102 and the image capture units 103 are arranged at regular intervals (here, a phase angle of) 45° in a longitude direction on a spherical surface 121a of the spherical three-dimensional object 121. A group of the image capture units 103 on one side, a group of the light source units 102, and a group of the image capture units 103 on the other side are arranged at regular intervals in the latitude direction of the three-dimensional object 121. A set of one the image capture unit 103, the light source unit 102, and the other image capture unit 103 lined up in the longitude direction of the three-dimensional object 121 constitutes one measurement region for the object to be measured SA. In a case where the three-dimensional object 121 has an internal space, wiring or the like for the light source unit 102 and the image capture unit 103 may be received in the internal space. Similarly to the case of FIG. 30, the arrangement intervals of the light source unit 102 and the image capture unit 103 may not necessarily be equally spaced intervals. In a case where the range of measurement for the object to be measured SA is covered, the single light source unit 102 and the single image capture unit 103 may be disposed on the three-dimensional object 121.

According to such a configuration, the three-dimensional objects 111 and 121 on which the light source unit 102 and the image capture unit 103 are disposed can be constituted as a probe of the three-dimensional measurement device 101. By using such three-dimensional objects 111 and 121, the sets of the light source units 102 and the image capture units 103 can be directed in different directions from each other, and thus it is possible to perform the three-dimensional shape measurement of the object to be measured SA at a wide solid angle. In addition, it is easy to apply the three-dimensional measurement device in applications such as, for example, mouth inspection, endoscopic inspection, inspection of narrow places such as the inside of a tube or a gap between walls, or inspection of household furniture, a device, or the like from below the floor, and to construct a handy-type three-dimensional measurement device.

The sinusoidal stripe pattern W5 is shown in FIG. 23, and it is important to reduce noise (luminance fluctuation) between adjacent patterns in forming such a stripe pattern. The noise between adjacent patterns can be considered to cause a fluctuation in position, for example, when the phase shift method is applied, and to influence the accuracy of measurement. Consequently, in realizing the formation of a stripe pattern in consideration of the reduction of noise between adjacent patterns, for example, as shown in FIG. 32, a configuration in which the S-iPMSEL 1 that emits a one-dimensional multi-point pattern and a one-dimensional lens 51 are combined can be adopted.

Figure 32:
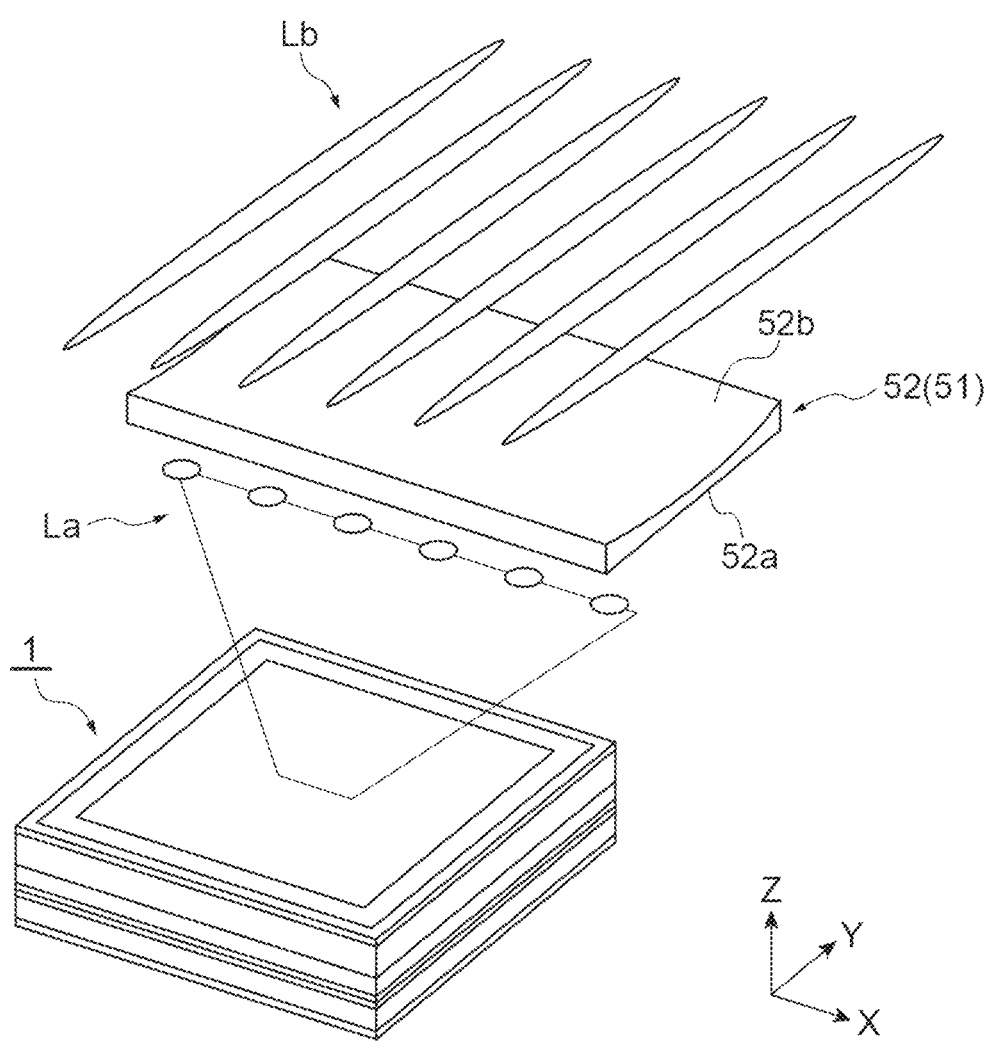
FIG. 32 is a perspective view illustrating a formation example of the sinusoidal stripe pattern.

In the example of FIG. 32, the one-dimensional lens 51 is a one-dimensional concave lens 52. The medium of the one-dimensional concave lens 52 is, for example, glass. One surface 52a of the one-dimensional concave lens 52 is a flat surface, and the other surface 52b is a concave surface. The one-dimensional concave lens 52 is disposed on the surface of the S-iPMSEL 1 (the light emission surface of a laser beam) with the one surface 52a directed to the S-iPMSEL 1. The one-dimensional concave lens 52 may be coupled to the surface of the S-iPMSEL 1, and be integrated with the S-iPMSEL 1. The lens phase of the one-dimensional concave lens 52 is obtained by the following Expression (40). In the following Expression (40), q is a lens phase, λ is the wavelength of a laser beam in a lens medium, and f is a focal length.

$$\phi(y) = \frac{2\pi}{\lambda}\left(\sqrt{y^2 + f^2} - f\right) \quad (40)$$

Figure 33B:
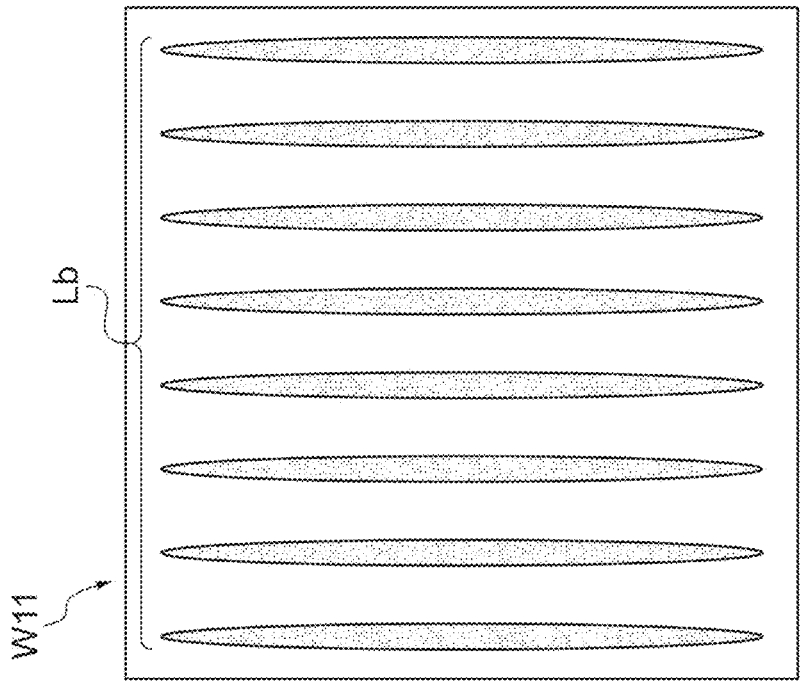
FIG. 33B is a schematic diagram illustrating an example of a stripe pattern using the multi-point pattern shown in FIG. 33A.
Figure 33A:
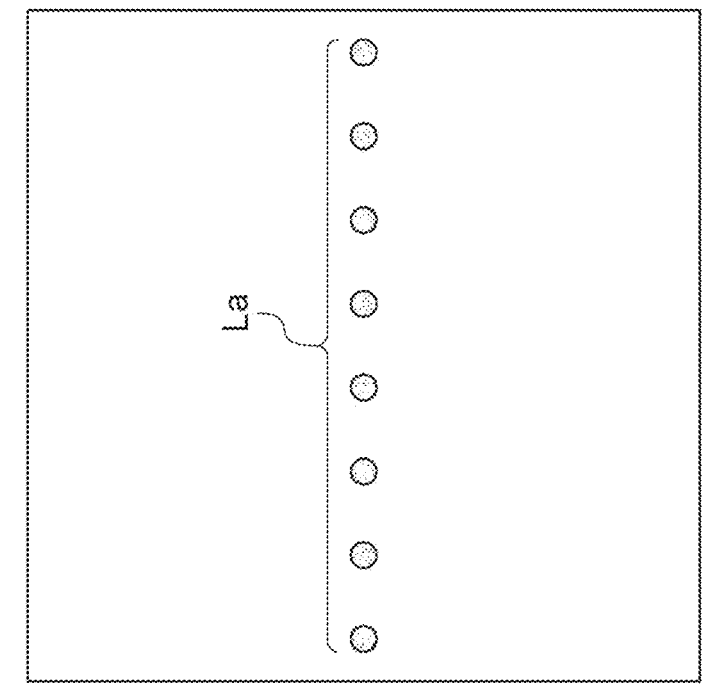
FIG. 33A is a schematic diagram illustrating an example of a laser beam of a multi-point pattern.

In the examples of FIGS. 32 and 33A, laser beams La of a multi-point pattern from the S-iPMSEL 1 are arrayed at predetermined intervals in the X direction. In the example of FIG. 32, the one-dimensional concave lens 52 is disposed so that its concave surface extends in the X-axis direction. The laser beams La of a multi-point pattern passing through the one-dimensional concave lens 52 do not change in the X-axis direction, and extend only in the Y-axis direction. Therefore, by passing the laser beams La of a multi-point pattern through the one-dimensional concave lens 52, a stripe pattern W11 in which linear laser beams Lb extending in the Y direction are lined up in the X-axis direction is obtained as shown in FIG. 33B.

In a case where the stripe pattern is brought closer to a sinusoidal shape, for example, as shown in FIG. 34A, laser beams La of a multi-point pattern are formed, and the luminance of each laser beam is controlled to be sinusoidal in the X-axis direction. By passing such laser beams La of a multi-point pattern through the one-dimensional concave lens 52, in a stripe pattern W12 shown in FIG. 34B, the linear laser beams Lb extending in the Y direction are lined up in the X-axis direction, and the luminance of each of the laser beams Lb changes in a sinusoidal manner in the X-axis direction.

In FIGS. 33A and 34A, the laser beams La of a multi-point pattern are linearly lined up in the X-axis direction, but the laser beams La may not necessarily be linearly lined up, and may be shifted periodically or randomly in the Y-axis direction. The one-dimensional lens 51 is not limited to the one-dimensional concave lens 52 insofar as the laser beams La of a multi-point pattern can be extended in a one-dimensional direction, and may be a Powell lens or a Lineman lens that functions as a line generator. The one-dimensional lens 51 may be a flat lens such as, for example, a Fresnel lens, a microlens, or a meta-lens.

Figure 35A:
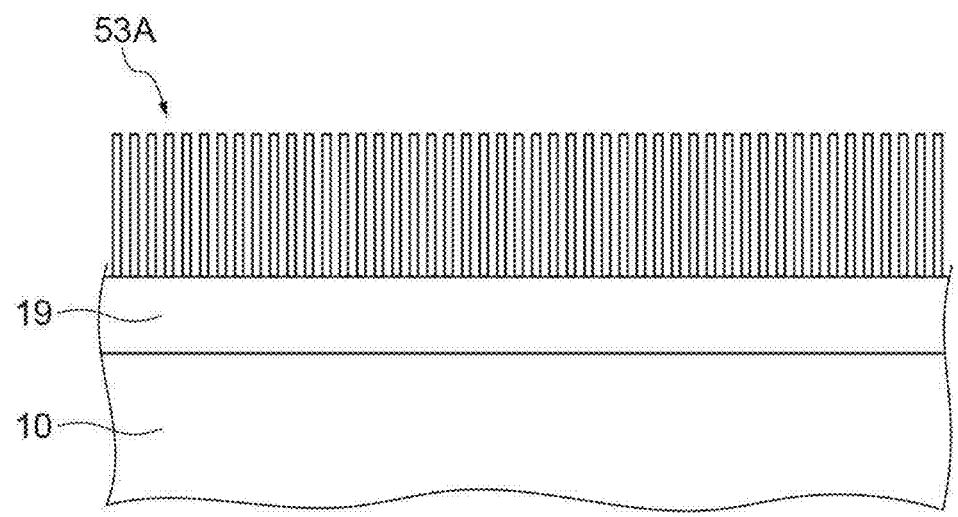
FIG. 35A is a schematic cross-sectional view illustrating an example of a configuration of a meta-lens structure.
Figure 35B:
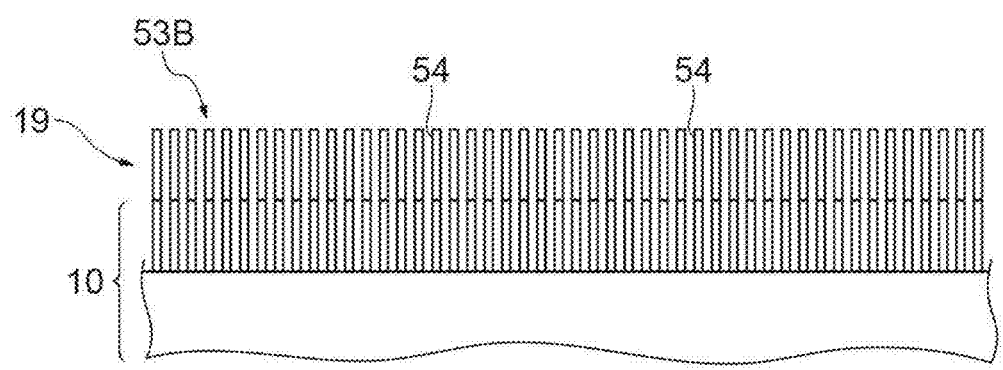
FIG. 35B is a schematic cross-sectional view illustrating another example of the configuration of the meta-lens structure.

In a case where a meta-lens is used, a resonant-type meta-lens structure 53A, for example, as shown in FIG. 35A may be adopted, or a refractive index modulation-type meta-lens structure 53B, for example, as shown in FIG. 35B may be adopted. As shown in FIG. 35A, in a case where the resonant-type meta-lens structure 53A is adopted, the configuration material of the meta-lens structure 53A is a material having a higher refractive index than an underlying layer. For example, in a case where the underlying layer (for example, the antireflection film 19) is SiN, amorphous silicon can be used as the configuration material of the meta-lens structure 53A. The height and diameter of a unit lattice constituting the meta-lens structure 53A is set on the basis of the lens phase obtained in Expression (40) above.

As shown in FIG. 35B, in a case where the refractive index modulation-type meta-lens structure 53B is adopted, the meta-lens structure 53B can be formed by etching the surface of the S-iPMSEL 1. For example, the refractive index modulation-type meta-lens structure 53B can be formed on the surface of the S-iPMSEL 1 by forming hole portions 54 extending from the outermost layer (for example, the antireflection film 19) to the middle of the lower layer (for example, the semiconductor substrate 10) through etching. The depth and diameter of each of the hole portions 54 constituting the meta-lens structure 53B is set on the basis of the lens phase obtained in Expression (40) above.

What is claimed is:
1. A three-dimensional measurement device comprising:
one or a plurality of light source units configured to irradiate an object to be measured with measurement light having a predetermined pattern;
one or a plurality of image capture units configured to capture an image of the object to be measured which is irradiated with the measurement light; and
a measurement unit configured to measure a three-dimensional shape of the object to be measured on the basis of results of image capture performed by the image capture units,
wherein the light source units are constituted by an S-iPMSEL of M-point oscillation that outputs light of a band edge wavelength at M-point, and
the S-iPMSEL comprising:
an active layer; and
a phase modulation layer optically coupled with the active layer,
wherein the phase modulation layer comprises a fundamental layer and a plurality of different refractive index regions differing in refractive index from the fundamental layer and distributed two-dimensionally in a plane perpendicular to a thickness direction of the phase modulation layer and, when a virtual square lattice is set in the plane, respective centers of gravity of each different refractive index region is set at a position shifted from a lattice point position of a virtual square lattice in accordance with a phase pattern corresponding to a desired light image,
a position relative to a lattice point of a different refractive index region of the plurality of different refractive index regions is individually set in accordance with the desired light image, and
a magnitude of at least one of a plurality of in-plane wavenumber vectors in reciprocal lattice space of the phase modulation layer is made smaller than $2\pi/\lambda$, wherein $\lambda$ is an emission wavelength of the active layer.

2. The three-dimensional measurement device according to claim 1, further comprising:
a single light source unit; and
a plurality of the image capture units,
wherein the predetermined pattern of the measurement light is a periodic pattern consisting of any of a dot pattern, a stripe pattern, and a lattice pattern, and
the measurement unit measures the three-dimensional shape of the object to be measured on the basis of an active stereo method using the periodic pattern.

3. The three-dimensional measurement device according to claim 1, further comprising:
a single light source unit; and
a plurality of the image capture units,
wherein the predetermined pattern of the measurement light is a random dot pattern, and
the measurement unit measures the three-dimensional shape of the object to be measured on the basis of an active stereo method using the random dot pattern.

4. The three-dimensional measurement device according to claim 1, further comprising:
a single light source unit; and
a plurality of the image capture units,
wherein the predetermined pattern of the measurement light is a pattern having a uniform density, and
the measurement unit measures the three-dimensional shape of the object to be measured on the basis of an active stereo method using the pattern having a uniform density.

5. The three-dimensional measurement device according to claim 1, further comprising:
a plurality of the light source units; and
a single image capture unit,
wherein the predetermined pattern of the measurement light is a gray code pattern, and
the measurement unit measures the three-dimensional shape of the object to be measured on the basis of a triangulation method using the gray code pattern.

6. The three-dimensional measurement device according to claim 1, further comprising:
a plurality of the light source units; and
a single image capture unit,
wherein the predetermined pattern of the measurement light is a sinusoidal stripe pattern, and
the measurement unit measures the three-dimensional shape of the object to be measured on the basis of a phase shift method using the sinusoidal stripe pattern.

7. The three-dimensional measurement device according to claim 6, wherein the plurality of light source units output sinusoidal stripe patterns having different periods from each other.

8. The three-dimensional measurement device according to claim 1, further comprising:
a plurality of the light source units; and
a single image capture unit,
wherein the predetermined pattern of the measurement light is a sinusoidal stripe pattern, and
the measurement unit measures the three-dimensional shape of the object to be measured on the basis of a sampling moire method using the sinusoidal stripe pattern.

9. The three-dimensional measurement device according to claim 1, further comprising:
a plurality of the light source units; and
a single image capture unit,
wherein the predetermined pattern of the measurement light is a superimposition pattern obtained by superimposing a sinusoidal stripe pattern on a random dot pattern, and
the measurement unit measures the three-dimensional shape of the object to be measured on the basis of a phase shift method using the superimposition pattern.

10. The three-dimensional measurement device according to claim 1, further comprising:
a plurality of the light source units; and
a single image capture unit,
wherein the predetermined pattern of the measurement light includes a sinusoidal stripe pattern and a gray code pattern, and
the measurement unit measures the three-dimensional shape of the object to be measured on the basis of a phase shift method using the sinusoidal stripe pattern and a triangulation method using the gray code pattern.

11. The three-dimensional measurement device according to claim 1, further comprising:
a plurality of the light source units; and
a plurality of the image capture units,
wherein the predetermined pattern of the measurement light is a sinusoidal stripe pattern, and
the measurement unit measures the three-dimensional shape of the object to be measured on the basis of a phase shift method and an active stereo method using the sinusoidal stripe pattern.

12. The three-dimensional measurement device according to claim 1, wherein the light source units and the image capture units are disposed on a surface of a three-dimensional object.

* * * * *